United States Patent
Lee et al.

(10) Patent No.: US 9,933,699 B2
(45) Date of Patent: Apr. 3, 2018

(54) PELLICLE AGING ESTIMATION AND PARTICLE REMOVAL FROM PELLICLE VIA ACOUSTIC WAVES

(71) Applicant: TAIWAN SEMICONDUCTOR MANUFACTURING COMPANY, LTD., Hsin-Chu (TW)

(72) Inventors: Yu-Ching Lee, Hsin-Chu (TW); Ching-Fang Yu, Hsin-Chu (TW); Chun-Hung Lin, Hsin-Chu (TW); Sheng-Chi Chin, Hsin-Chu (TW); Ting-Hao Hsu, Hsin-Chu (TW); Mark Chang, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 232 days.

(21) Appl. No.: 14/658,399

(22) Filed: Mar. 16, 2015

(65) Prior Publication Data

US 2016/0274471 A1 Sep. 22, 2016

(51) Int. Cl.
*G01H 1/00* (2006.01)
*G01H 9/00* (2006.01)
(Continued)

(52) U.S. Cl.
CPC . *G03F 1/84* (2013.01); *G03F 1/62* (2013.01)

(58) Field of Classification Search
CPC ........... G03F 1/84; G03F 1/62; G01N 29/041; G01N 2291/0237; G01N 29/04;
(Continued)

(56) References Cited

U.S. PATENT DOCUMENTS 3,700,903 A * 10/1972 Adler et al. ........... G01H 9/002
 250/222.1
4,394,060 A * 7/1983 Verber et al. ...... G02B 6/12004
 324/76.36
(Continued)

FOREIGN PATENT DOCUMENTS

EP 1679513 A2 7/2006
JP 11-143054 A 5/1999
(Continued)

OTHER PUBLICATIONS

Author: Stephan Wagner, Title: Novel Micromechanical Bulk Acoustic Wave Resonator Sensing Concepts for Advanced Atomic Force Microscopy, Date: 2012, Publisher: KTH, Electrical Engineering, Microsystem Technology Department, pp. 19.*

(Continued)

*Primary Examiner* — Lisa Caputo
*Assistant Examiner* — Roger Hernandez-Prewitt
(74) *Attorney, Agent, or Firm* — Haynes and Boone, LLP

(57) ABSTRACT

A pellicle is disposed over a lithography mask. An acoustic wave generator is placed over the pellicle. The acoustic wave generator is configured to generate acoustic waves to cause the pellicle to vibrate at a target resonance frequency. A resonance detection tool is configured to detect an actual resonance frequency of the pellicle in response to the acoustic waves. One or more electronic processors are configured to estimate an age condition of the pellicle as a function of a shift of the actual resonance frequency from the target resonance frequency.

20 Claims, 17 Drawing Sheets

(51) Int. Cl.
*G01H 13/00* (2006.01)
*G01L 1/00* (2006.01)
*G01M 7/00* (2006.01)
*G01N 3/32* (2006.01)
*G01N 21/00* (2006.01)
*G01N 24/00* (2006.01)
*G01N 29/00* (2006.01)
*G01N 29/04* (2006.01)
*G03F 1/84* (2012.01)
*G03F 1/62* (2012.01)

(58) Field of Classification Search
CPC .... G01N 29/12; G01N 2291/014; G01H 9/00; G01H 13/00
USPC .............................................. 73/579; 430/325
See application file for complete search history.

(56) References Cited

U.S. PATENT DOCUMENTS

| | | | |
|---|---|---|---|
| 6,477,898 B1 | 11/2002 | Han et al. |
| 7,758,696 B2 | 7/2010 | Stoddard et al. |
| 8,628,897 B1 | 1/2014 | Lu et al. |
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,716,841 B1 | 5/2014 | Chang et al. |
| 8,722,286 B2 | 5/2014 | Yu et al. |
| 8,736,084 B2 | 5/2014 | Cheng et al. |
| 8,753,788 B1 | 6/2014 | Yu et al. |
| 8,764,995 B2 | 7/2014 | Chang et al. |
| 8,765,330 B2 | 7/2014 | Shih et al. |
| 8,765,582 B2 | 7/2014 | Hsu et al. |
| 8,785,084 B2 | 7/2014 | Lu et al. |
| 8,828,625 B2 | 9/2014 | Lu et al. |
| 8,837,810 B2 | 9/2014 | Chen et al. |
| 8,841,047 B2 | 9/2014 | Yu et al. |
| 8,877,409 B2 | 11/2014 | Hsu et al. |
| 2004/0032581 A1* | 2/2004 | Nikoonahad et al. ................... G01N 21/9501 356/237.2 |
| 2004/0256552 A1* | 12/2004 | Kawakatsu ............ B82Y 35/00 250/306 |
| 2010/0220394 A1* | 9/2010 | Kawai .................. H04N 5/2171 359/508 |
| 2011/0014577 A1 | 1/2011 | Hashimoto |
| 2012/0076330 A1* | 3/2012 | Cohen et al. .......... H04R 1/005 381/191 |
| 2012/0308112 A1 | 12/2012 | Hu et al. |
| 2013/0201461 A1 | 8/2013 | Huang et al. |
| 2014/0101624 A1 | 4/2014 | Wu et al. |
| 2014/0111779 A1 | 4/2014 | Chen et al. |
| 2014/0119638 A1 | 5/2014 | Chang et al. |
| 2014/0123084 A1 | 5/2014 | Tang et al. |
| 2014/0226893 A1 | 8/2014 | Lo et al. |
| 2014/0253901 A1 | 9/2014 | Zhou et al. |
| 2014/0256067 A1 | 9/2014 | Cheng et al. |
| 2014/0257761 A1 | 9/2014 | Zhou et al. |
| 2015/0158056 A1* | 6/2015 | Rastegar ........... H01L 21/67115 134/1 |

FOREIGN PATENT DOCUMENTS

| | | |
|---|---|---|
| JP | 2003315982 A * | 11/2003 |
| JP | 2010-45283 A | 2/2010 |
| KR | 10-2013-0126076 A | 11/2013 |

OTHER PUBLICATIONS

Authors: Michael Gostein, Alex Mazurenko, Alex A. Maznev, Philips and Michelle T. Schulberg, Title: Measuring Young's modulus of low-k dielectrics using surface acoustic waves, Date: 2007, Publisher: Micro Magazine COM, pp. 12.*

Authors: D C Hurley, V K Tewary and A J Richards, Title: Surface acoustic wave methods to determine the anisotropic elastic properties of thin films, Date: Aug. 2, 2001, Publisher: Institute of Physics Publishing, Meas. Sci. Technol. 12 pp. 1486-1494.*

Korean Application No. 10-2015-0166802, Office Action dated Jul. 12, 2016, 14 pgs.

* cited by examiner

PELLICLE AGING ESTIMATION AND PARTICLE REMOVAL FROM PELLICLE VIA ACOUSTIC WAVES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows.

Pellicles are used in lithography processes to protect a photomask from damage or contamination from particles. However, as pellicles age (for example through lithography exposure), they may become brittle or lose its elasticity. The optimal, thermal, and/or mechanical properties of pellicles also become worse as pellicles age. Existing methods of determining pellicle aging have not been entirely satisfactory. In addition, existing methods of removing contaminant particles from pellicles may damage the pellicle as well.

Therefore, an effective method and apparatus are needed to determine pellicle aging and to remove contaminant particles from the pellicle.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
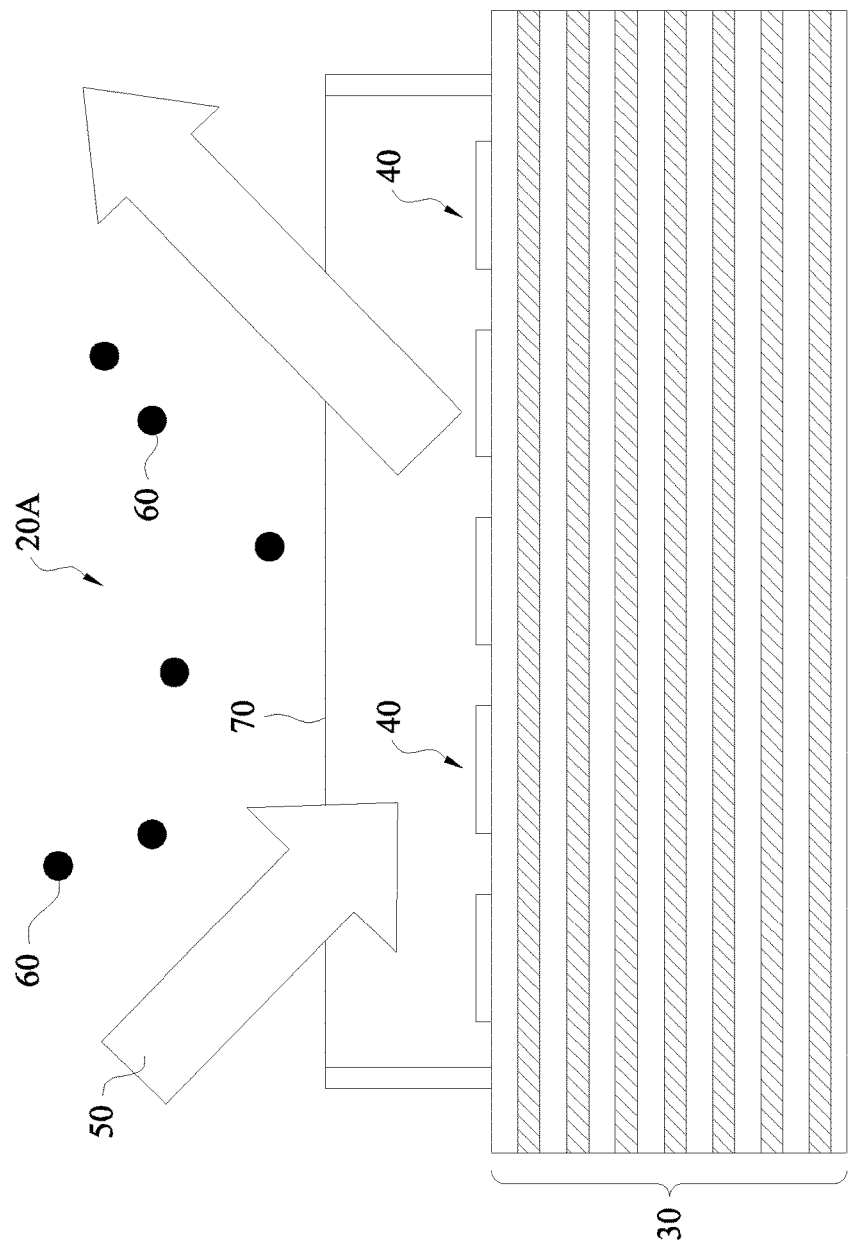
FIGS. 1A-1B each illliustrate a cross-sectional view of an example lithography system.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a simplified cross-sectional view of a portion of a lithography system 20A, constructed in accordance with some embodiments. The lithography system 20A pertains to extreme ultraviolet (EUV) lithography and includes an EUV lithography photomask 30 (thereafter interchangeably referred to as the mask for reasons of simplicity). In some embodiments, the mask 30 includes a plurality of layers. Patterns 40 are formed on the mask 30. In an EUV lithography process, light (or radiation) 50 exposes the patterns 40 so as to transfer their image to a photoresist layer formed on a wafer (not illustrated). The patterned photoresist layer is then used to pattern the layers of the wafer therebelow.

Figure 1B:
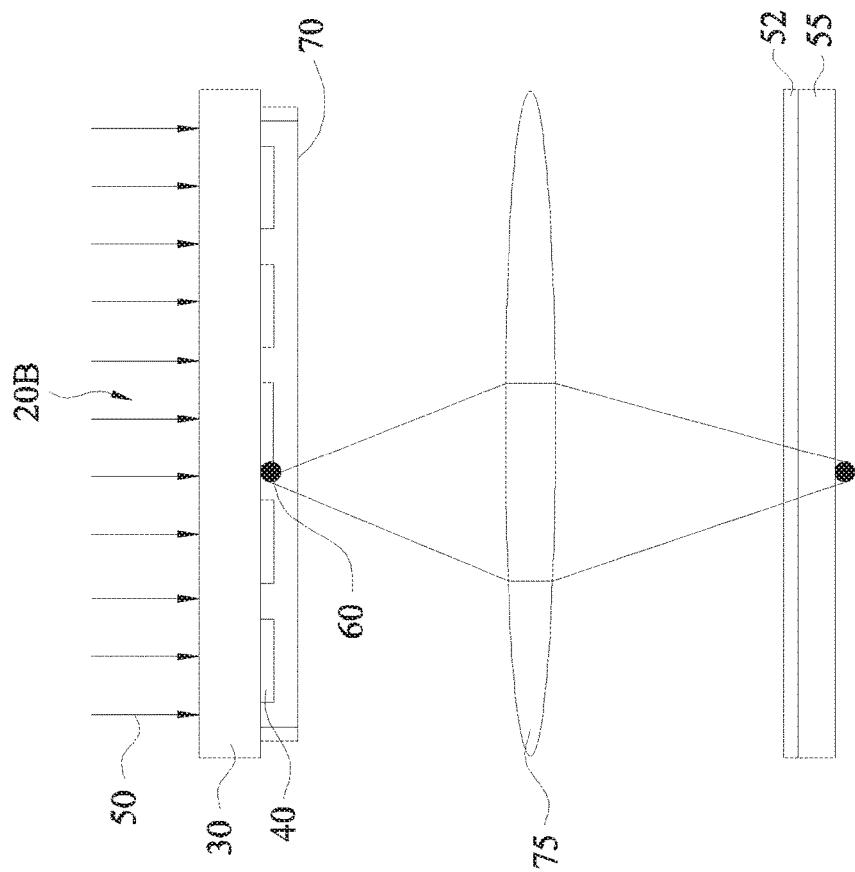

FIG. 1B is a simplified cross-sectional view of a portion of a lithography system 20B, constructed in accordance with some embodiments. For reasons of simplicity, similar elements in FIGS. 1A and 1B will be labeled the same. The lithography system 20B pertains to deep ultraviolet (DUV) lithography and includes a DUV lithography photomask 30. Unlike the EUV mask 30 in FIG. 1A, the DUV mask 30 in FIG. 1B does not have a plurality of layers. Patterns 40 are formed on the mask 30. In a DUV lithography process, light (or radiation) 50 exposes the patterns 40 so as to transfer their image (through a lens 75) to a photoresist layer 52 formed on a wafer 55.

Although the environment in which the lithography process (whether it's EUV or DUV) is performed is kept relatively clean, there may still be contaminant particles, for example contaminant particles 60, that would otherwise interfere with the patterning process if they get on the mask 30. For example, the presence of contaminant particles 60 may lead to defocus or out-of-focus issues. Therefore, a pellicle 70 is used to protect the mask 30. The pellicle 70 includes a thin membrane (e.g., a polymer membrane) that is placed over the surface of the mask 30 on which the patterns 40 are formed. Thus, the contaminant particles 60 would fall on the pellicle 70, rather than on the mask 30. The contaminant particles 60 may then be removed from the pellicle 70 as necessary. In this manner, the pellicle 70 serves as protection for the mask 30. It is understood that a pellicle may be used for either the EUV mask in FIG. 1A or the DUV mask in FIG. 1B, and thus the pellicle 70 illustrated in FIG. 1 is not intended to be limited to only one type of pellicle for a specific lithography mask. For reasons of simplicity, however, the DUV mask of FIG. 1B with a pellicle implemented thereon is used hereinafter to illustrate the various aspects of the present disclosure, though the same concepts may equally apply to the EUV mask in FIG. 1A.

As the pellicle 70 undergoes repeated use, it begins to age. For example, the exposure process in a lithography process causes the pellicle 70 to age. In addition, the pellicle 70 may age even without undergoing lithography exposure, and this may be attributed to poor quality of the pellicle. Due to the aging, the pellicle 70's optical, thermal, and mechanical properties may change. For example, the pellicle 70 may become more brittle and less elastic as it ages, which may make it easier to break or crack. If the pellicle 70 breaks (due to aging) during the lithography process, the mask 30 is no longer being protected and thus may be scratched or otherwise damaged. Mask repair is expensive, and sometimes the damage may be sufficiently great such that the mask 30 can no longer be used. Therefore, the aging of the pellicle 70, if not detected and addressed in advance, may shorten the life span of the mask 30. On the other hand, it is wasteful if the pellicle 70 is discarded too early (i.e., before it has aged to the point where it should no longer be used). Therefore, it is desirable to accurately determine the age condition of the pellicle 70, so that it can be used as long as possible yet before it poses any risks of breaking and causing damage to the mask. In addition, the contaminant particles 60 on the pellicle 70 still need to be removed as well. Existing methods of detecting and removing the contaminant particles 60 may be prone to damaging the pellicle 70. Furthermore, existing methods of detecting and removing the contaminant particles 60 may inadvertently damage the mask as well.

To solve these issues discussed above, the present disclosure proposes a novel way of using acoustic waves to estimate the age condition of a pellicle and to remove the contaminant particles without damaging the pellicle. The methods and apparatuses discussed below apply to the EUV lithography context as well as to the standard optical lithography context (e.g., DUV lithography).

Figure 2:
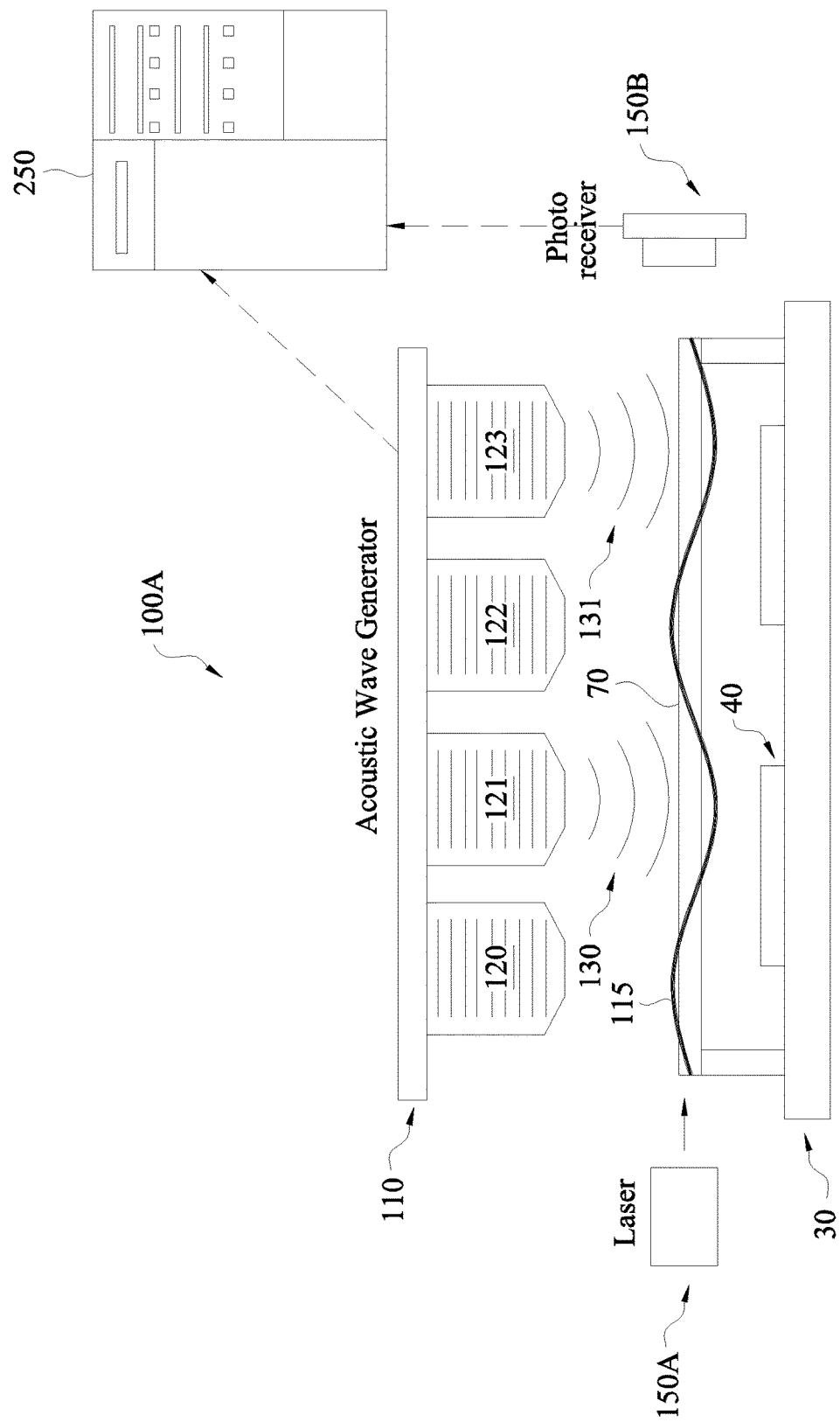
FIGS. 2, 4-5, and 7 are simplified diagrams of systems of estimating an age condition of a pellicle in accordance with embodiments of the present disclosure.

FIG. 2 illustrates a simplified schematic diagram of an embodiment of a system 100A for estimating or determining the aging condition of a pellicle. As discussed above, a mask 30 is provided, on which patterns 40 are formed. A pellicle 70 is placed over the mask 30 to protect the mask 30. To estimate the age condition of the pellicle 70, an acoustic wave generator 110 is placed above the pellicle. The acoustic wave generator 110 includes an array acoustic transducer (or acoustic transducer array) in the illustrated embodiment, but it may also include a microphone in other embodiments. The acoustic wave generator 110 generates one or more acoustic waves to force the pellicle 70 into a certain mode of oscillation (as represented by the wave 115), where it should vibrate at a target resonance frequency.

Figure 3:
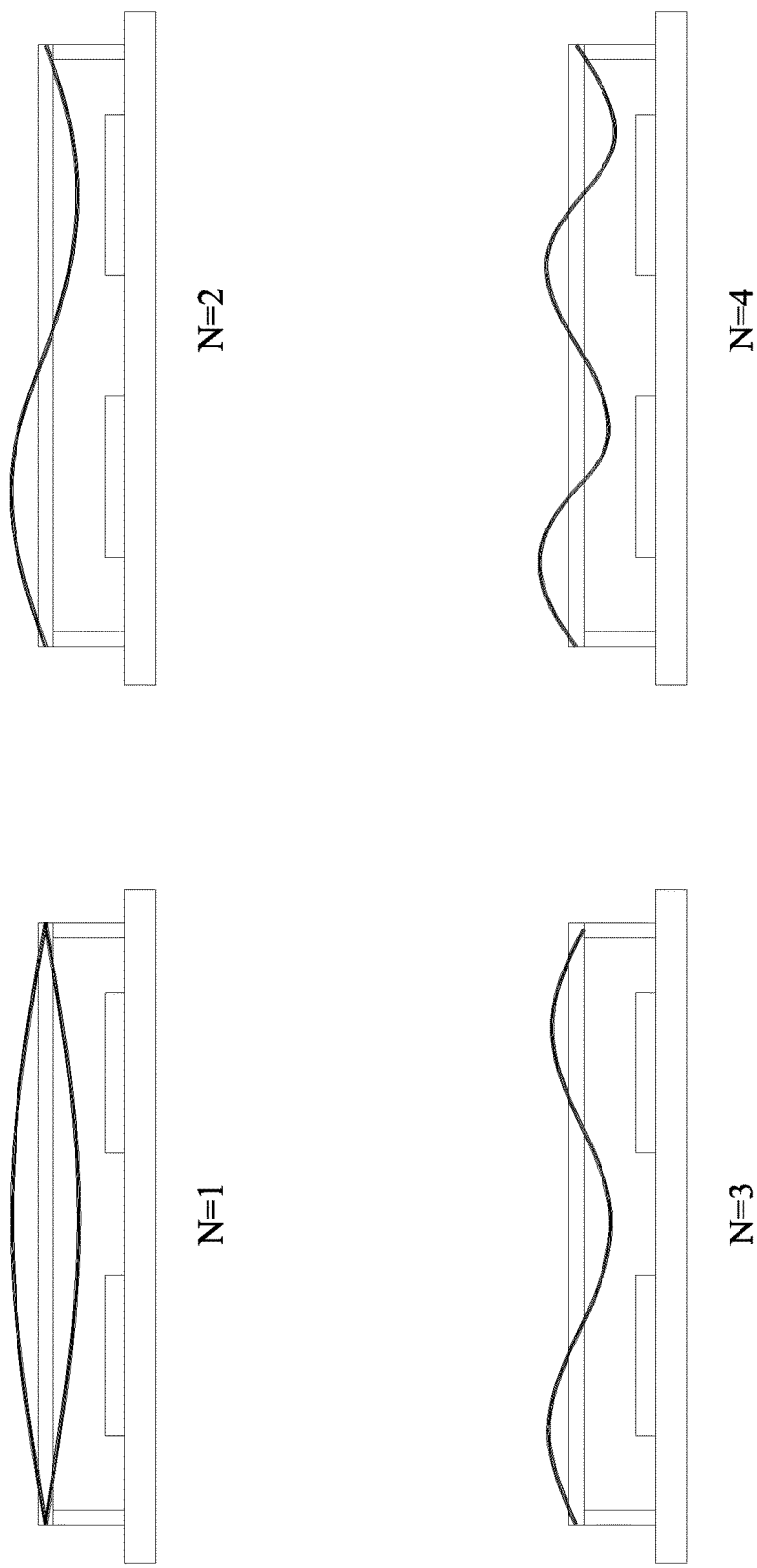
FIG. 3 illustrates various example modes of oscillation of a pellicle in accordance with some embodiments according to embodiments of the present disclosure.

In more detail, the acoustic wave generator 110 includes four acoustic transducers 120-123. Each of the acoustic transducers 120-123 is capable of outputting an acoustic wave (or pressure wave) toward the pellicle 70. In the example shown in FIG. 2, the acoustic transducers 121 and 123 are active so as to generate acoustic waves 130 and 131 toward the pellicle 70. The acoustic waves 130 and 131 force the pellicle 70 to bend and vibrate in a certain mode of oscillation. In the illustrated embodiment, the pellicle 70 vibrates in a third mode of oscillation, where the mode of oscillation is represented by N (also referred to as a vibrational mode or harmonic number). To provides more clarity regarding the various modes of oscillation, FIG. 3 illustrates four example modes of oscillation, where N=1 corresponds to a first mode of oscillation, N=2 corresponds to a second mode of oscillation, N=3 corresponds to a third mode of oscillation, and N=4 corresponds to a fourth mode of oscillation. Of course, there may be any other number of modes of oscillation (e.g., N>4), but they are not illustrated herein for reasons of simplicity.

For any given mode of oscillation N, there is a corresponding target resonance frequency for the pellicle 70. The target resonance frequency may be calculated using the following equation:

$$f = Nv/2L = \frac{N\sqrt{\frac{T}{\rho}}}{2L} = \frac{N\sqrt{\frac{T}{M/L}}}{2L}$$

where f represents the target or expected resonance frequency, N represents the mode of oscillation, L represents the length of the pellicle 70 (measuredly horizontally or laterally in FIGS. 1-3), T represents the membrane tension force on the pellicle 70, v represents acoustic speed, M represents mass of the pellicle, and p represents the density of the pellicle 70.

Referring back to FIG. 2, the system 100A also includes a resonance detection tool. The resonance detection tool is configured to detect the actual resonance frequency of the pellicle 70 in response to the acoustic waves 130-131 applied by the acoustic wave generator 110. In the embodiment illustrated in FIG. 2, the resonance detection tool includes at least two components 150A and 150B. The component 150A is a source component that is located on one side of the pellicle 70 (e.g., to the left of the pellicle 70 as illustrated in FIG. 2), and the component 150B is a sensor component that is located on the side of the pellicle 70 opposite from where the source component 150A is located (e.g., to the right of the pellicle 70 as illustrated in FIG. 2). The source component 150A generates a signal that travels across the length of the pellicle 70 (i.e., horizontally in FIG. 2). The sensor component 150B receives the signal generated by the source component 150A. Based on the signal received by the sensor component 150B, the actual resonance frequency of the pellicle 70 may be determined. For example, at the resonance frequency, the amplitude of the signal should be the greatest.

In some embodiments, the sensor component 150 itself includes the necessary circuitry, processors, and/or memory to accurately determine the actual resonance frequency of the pellicle 70. In other embodiments, another suitable signal analysis machine may be included in the resonance detection tool to assist in making the determination of the actual resonance frequency of the pellicle 70.

Figure 4:
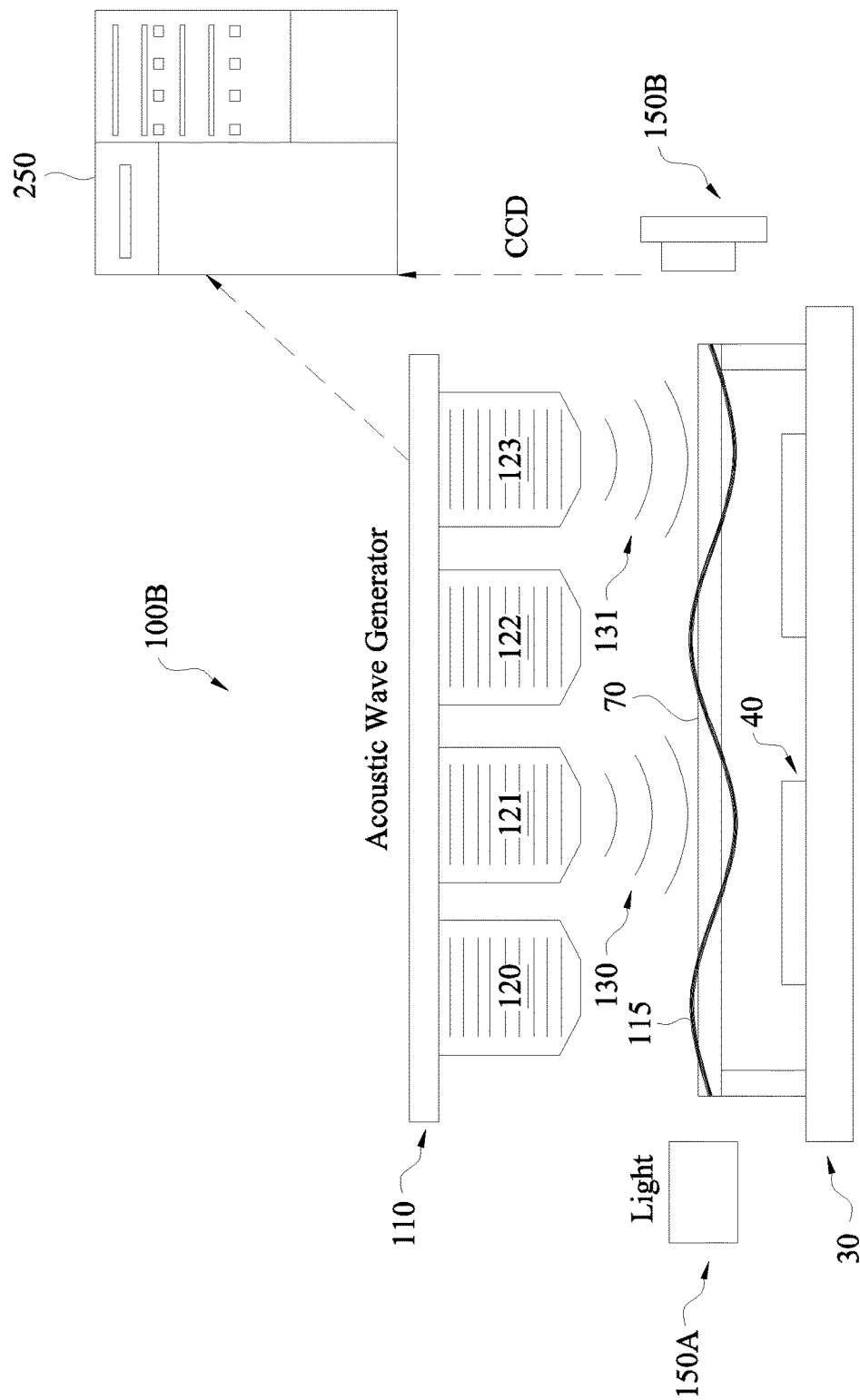

There are also various ways in which the resonance detection tool can be implemented. In the embodiment illustrated in FIG. 2, the source component 150A of the resonance detection tool includes a laser, and the sensor component 150 of the resonance detection tool includes a photo receiver. Referring now to FIG. 4, where an alternative embodiment of a system 100B for estimating or determining the aging condition of the pellicle 70 is illustrated. In the system 100B, the source component 150A of the resonance detection tool includes a light, and the sensor component 150B of the resonance detection tool includes a charge-coupled device (CCD). Similar to the system 100A, the light generates a signal that travels across the length of the pellicle 70. The CCD receives the signal and analyzes it to determine the actual resonance frequency of the pellicle 70.

Figure 5:
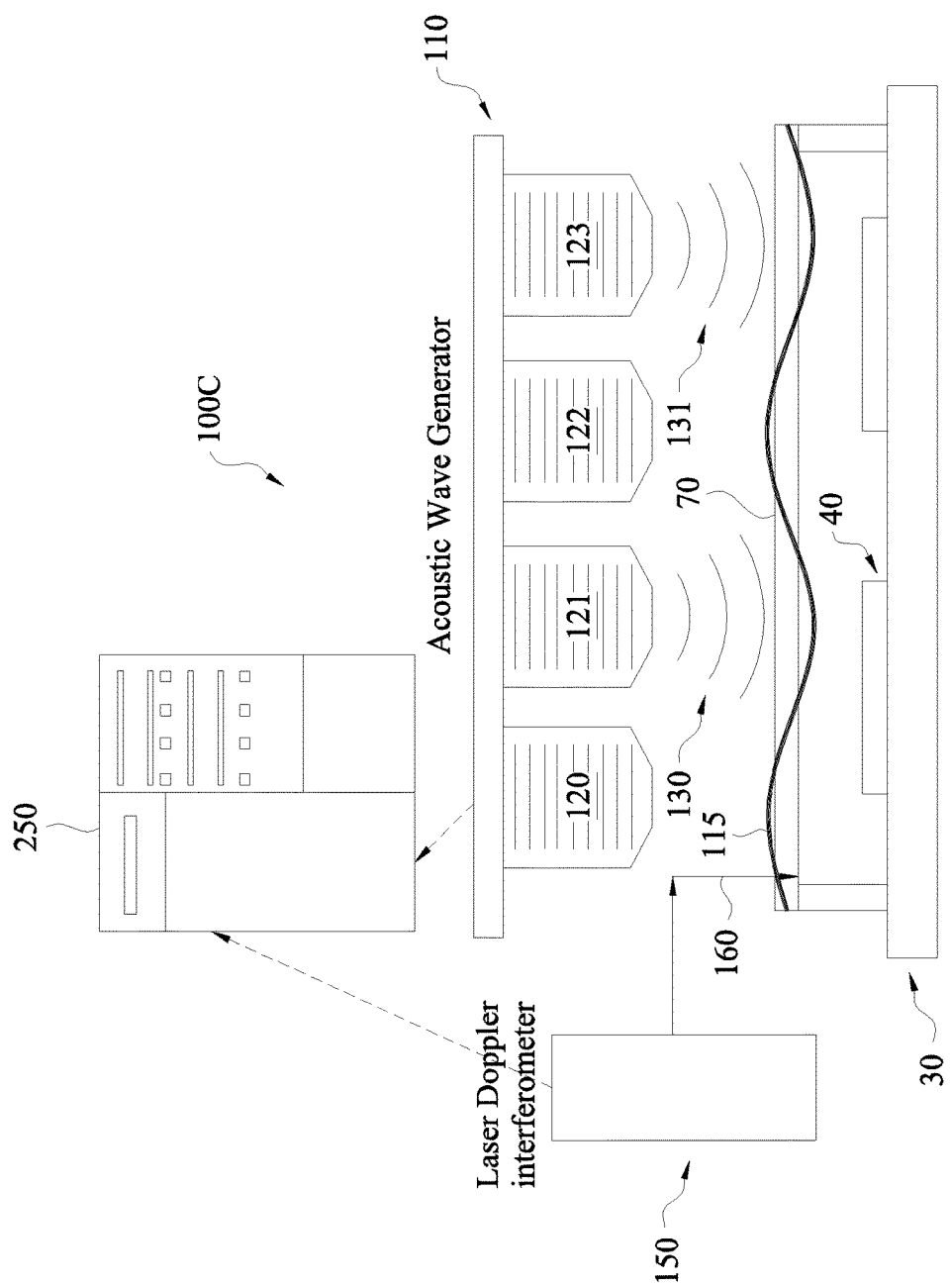

Referring now to FIG. 5, where yet another alternative embodiment of a system 100C for estimating or determining the aging condition of the pellicle 70 is illustrated. In the system 100C, the resonance detection tool does not include two separate source and sensor components. Instead, the resonance detection tool includes a Laser Doppler Interferometer 150, which can be used to make non-contact vibration measurements of the surface of the pellicle 70. A laser beam 160 from the Laser Doppler Interferometer 150 is directed at the surface of the pellicle 70, and the vibration amplitude and frequency of the pellicle 70 are extracted from the Doppler shift of the reflected laser beam frequency due to the motion of the surface. An output of the Laser Doppler Interferometer 150 may be an analog voltage that is directly proportional to the target velocity component along the direction of the laser beam 160.

Figure 6A:
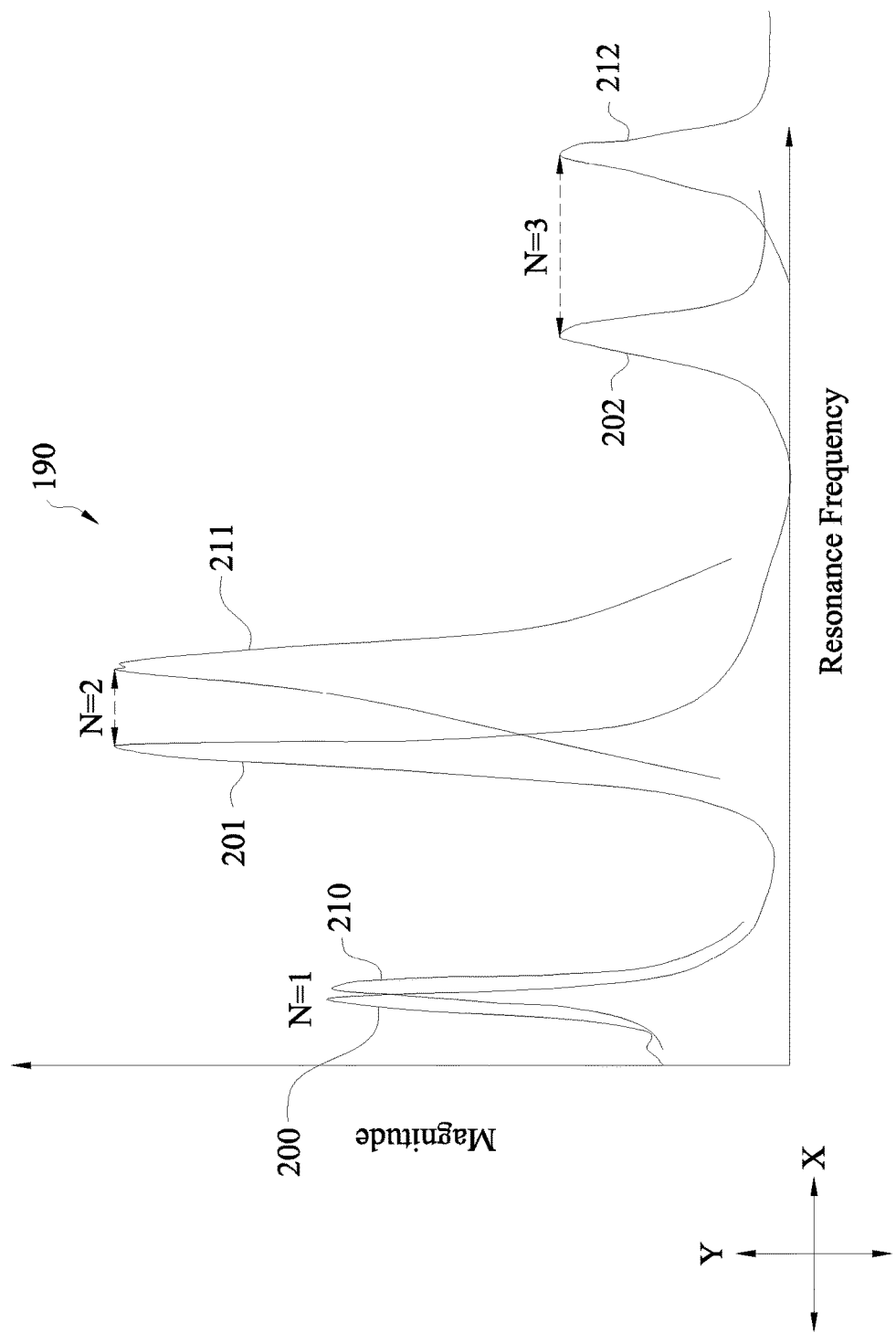
FIG. 6A is a graph that visually illustrates how sensitive a particular pellicle is in response to acoustic waves with different modes of oscillation according to embodiments of the present disclosure.

According to various aspects of the present disclosure, the age condition of the pellicle 70 may be indicated by a shift of the actual resonance frequency of the pellicle 70 from the target resonance frequency of the pellicle 70. Referring to FIG. 6A, a graph 190 visually illustrates the response of the pellicle 70 corresponding to acoustic waves with different modes of oscillation (different N). In more detail, the graph 190 includes an X-axis representing resonance frequency, and a Y-axis representing magnitude (or amplitude).

Plots 200-202 and 210-212 are shown in the graph 190. From plots 200, 201, and 202, the target (or expected) resonance frequencies of the pellicle in response to the acoustic waves can be extracted. For example, plots 200-202 may correspond to measurement data from a new pellicle (which has not aged yet) at three different modes of oscillation. Specifically, plot 200 corresponds to the first mode of oscillation where N=1, plot 201 corresponds to the second mode of oscillation where N=2, and plot 202 corresponds to the third mode of oscillation where N=3. Thus, the frequency corresponding to the peak of the plot 200 is the target resonance frequency of the pellicle when N=1, the frequency corresponding to the peak of the plot 201 is the target resonance frequency of the pellicle when N=2, and the frequency corresponding to the peak of the plot 202 is the target resonance frequency of the pellicle when N=3. Again, as discussed above, the target resonance frequency of the pellicle may be calculated using the following equation:

$$f = Nv/2L = \frac{N\sqrt{\frac{T}{\rho}}}{2L} = \frac{N\sqrt{\frac{T}{M/L}}}{2L}$$

One reason for applying acoustic waves with different modes of oscillation is to ascertain which mode of oscillation is the best (or best suited) for a particular type of pellicle, so that mode of oscillation should be used to determine the age condition of the pellicle. In more detail, each type of pellicle (e.g., based on its material composition, manufacturer, size/geometry, etc.) may exhibit different amounts of sensitivity to acoustic waves with different modes of oscillation. For example, pellicle A may be the most sensitive to the N=1 mode of oscillation, pellicle B may be the most sensitive to the N=2 mode of oscillation, and pellicle C may be the most sensitive to the N=3 mode of oscillation. Initially, the sensitivity of each type of pellicle in response to the different modes of oscillation is typically unknown. Therefore, for a new pellicle, various acoustic waves with different modes of oscillation (N=1, 2, 3 in the example shown in FIG. 6A) are applied to that pellicle in turn. The results are illustrated as the plots 200, 201, and 202 (corresponding to N=1, 2, 3, respectively). The peaks of the plots 200-202 should also align closely with the calculated resonance frequencies based on the equation f=Nv/2L discussed above.

After the pellicle has aged somewhat, the same acoustic waves with the different modes of oscillation are applied to the pellicle again. The results are illustrated as plots 210, 211, and 212 (corresponding to N=1, 2, 3, respectively). It can be seen that as the pellicle begins to age, its resonance frequency begins to shift. However, the degree or amount of shift is different for each mode of oscillation. In this example, the first mode of oscillation N=1 corresponds to the smallest shift of resonance frequency (represented by the smallest horizontal offset between the plots 200-210), the second mode of oscillation N=2 corresponds to a medium amount of shift of resonance frequency (represented by the medium amount of horizontal offset between the plots 201-211), and the third mode of oscillation N=3 corresponds to the largest shift of resonance frequency (represented by the greatest horizontal offset between the plots 202-212).

Based on the results shown in FIG. 6A, it can be determined that this particular type of pellicle is the most sensitive to the acoustic wave with the third mode of oscillation N=3. Thereafter, for this particular type of pellicle, the third mode of oscillation N=3 will be used to determine its age condition. Of course, other types of pellicles may have the greatest sensitivity to the N=1 or N=2 mode of oscillation, and those other modes of oscillation may be used to determine the age condition of the other types of pellicles. It is also understood that although FIG. 6A shows three different modes of oscillation (N=1, N=2, and N=3), any other mode of oscillation may be used in alternative embodiments. For reasons of simplicity, these other modes of oscillation are not illustrated herein.

Figure 6B:
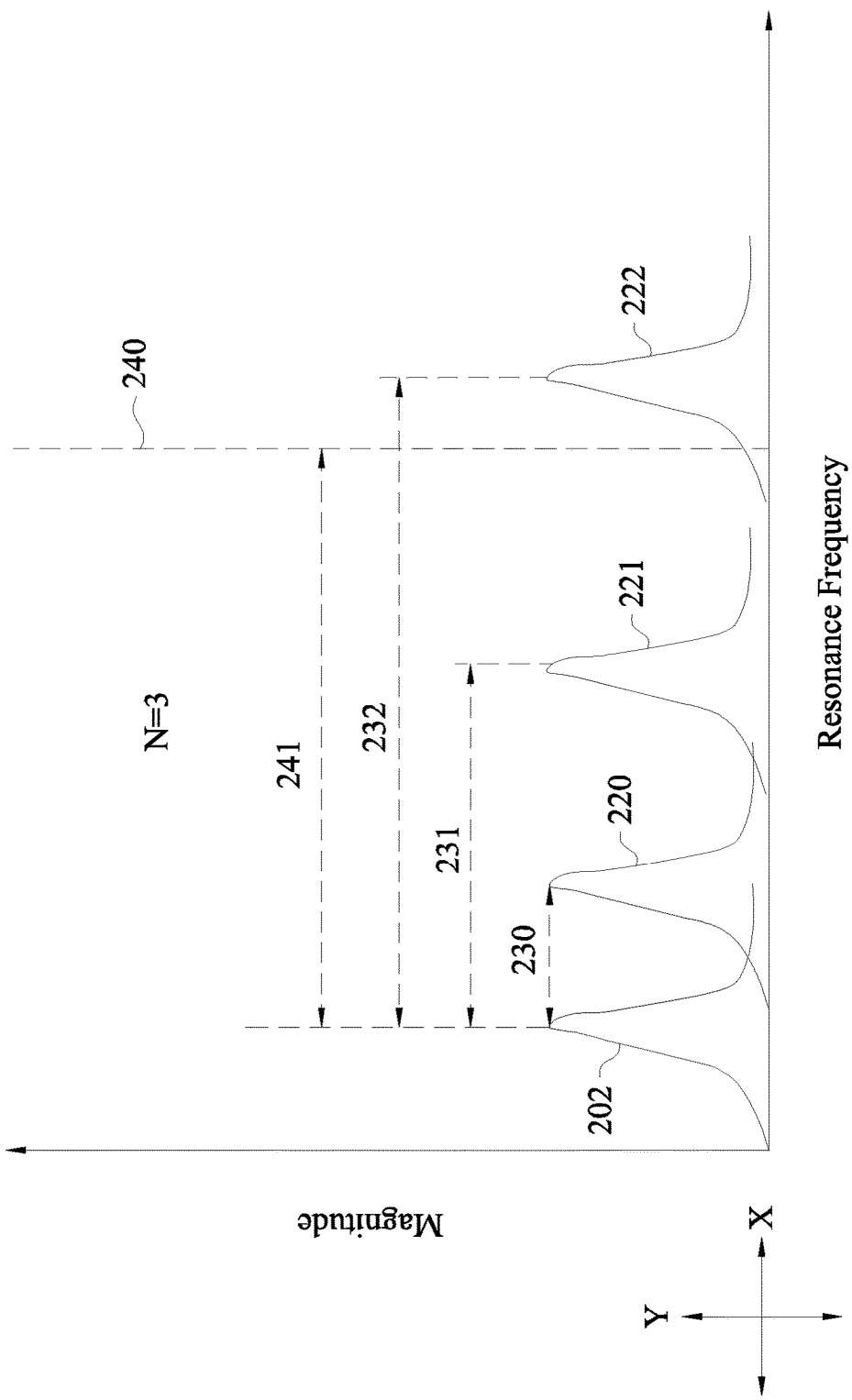
FIG. 6B is a graph that visually illustrates how the aging of a pellicle corresponds to a shift of an actual resonance frequency from a target resonance frequency in response to acoustic waves according to embodiments of the present disclosure.

Referring now to FIG. 6B, once the acoustic wave with a certain mode of oscillation is determined (N=3 in this example), the pellicle's age condition may be periodically monitored by applying acoustic waves with that mode of oscillation (N=3 herein). As discussed above, when the pellicle is in good age condition, the actual resonance frequency should align or match up closely with the expected or target resonance frequency. In other words, when the age of the pellicle is good, the plot of the pellicle should closely align with a plot 202, which as discussed with reference to FIG. 6A, is the response of the pellicle when it is new.

However, as the pellicle begins to age (represented by plots 220, 221, and 222), its resonance frequency begins to drift farther and farther away from the target frequency. For example, as the pellicle first begins to age, the resonance frequency of the plot 220 is separated from the resonance frequency of the plot 202 by a distance 230. The distance 230 may be relatively small, and thus the age condition of the pellicle may still be considered to be relatively good at this point.

As the pellicle begins to age more, the resonance frequency of the plot 221 now has a greater distance 231 from the target resonance frequency of the plot 202. This indicates that the age condition of the pellicle is becoming advanced, and it may have already lost a good amount of its elasticity.

Finally, at the pellicle continues to age, the resonance frequency of the plot 222 now has a distance 232 from the target resonance frequency of the plot 202. This distance 232 is outside or beyond an acceptable limit 240 (which has a distance 241 from the target frequency). This indicates that the age condition of the pellicle associated with the plots 202 and 212 is quite old, and it may experience failure (e.g., breakage) soon. Thus, the pellicle needs to be replaced before it breaks and causes damage to the lithography photomask. In this manner, it can be seen that by monitoring the response of the pellicle at different modes of oscillation, the age condition of the pellicle can be determined, and corresponding actions may be taken accordingly (e.g., replacing the pellicle when it is too old).

It is also understood that the pellicle age estimation procedure discussed herein may be done by a person, or it may also be performed involving one or more electronic processors in a machine, for example a computer or computerized equipment 250 in systems 100A/B/C shown in FIGS. 2, 4, and 5. The computer or computerized equipment 250 may still be considered to be part of the system 100A, 100B, or 100C. Via one or more wired or wireless connections, the computer or computerized equipment 250 is communicatively coupled with the acoustic wave generator 110 and/or the resonance detection tool (e.g., the sensor 150B or the Laser Doppler Interferometer 150).

The computer or computerized equipment 250 includes electronic memory storing instructions and data and electronic processors configured to execute the instructions. In some embodiments, the target resonance frequency of a pellicle may be either stored on the computer or computerized equipment 250 or calculated by the computer or computerized equipment 250 in response to the wave acoustics conditions produced by the acoustic wave generator 110. The computer or computerized equipment 250 then receives the data indicating the actual resonance frequency of the pellicle 70 from the sensor component 150B. The computer or computerized equipment 250 calculates the difference (or shift) between the target and actual resonance frequencies and may compare it to one or more predefined thresholds. The predefined thresholds may correspond to different age conditions of the pellicle 70 (e.g., good, acceptable, bad, etc.). Depending on where the shift in resonance frequency falls in comparison with the predefined thresholds, the computer or computerized equipment 250 may automatically determine the age condition of the pellicle 70 and may inform a human operator accordingly.

Figure 7:
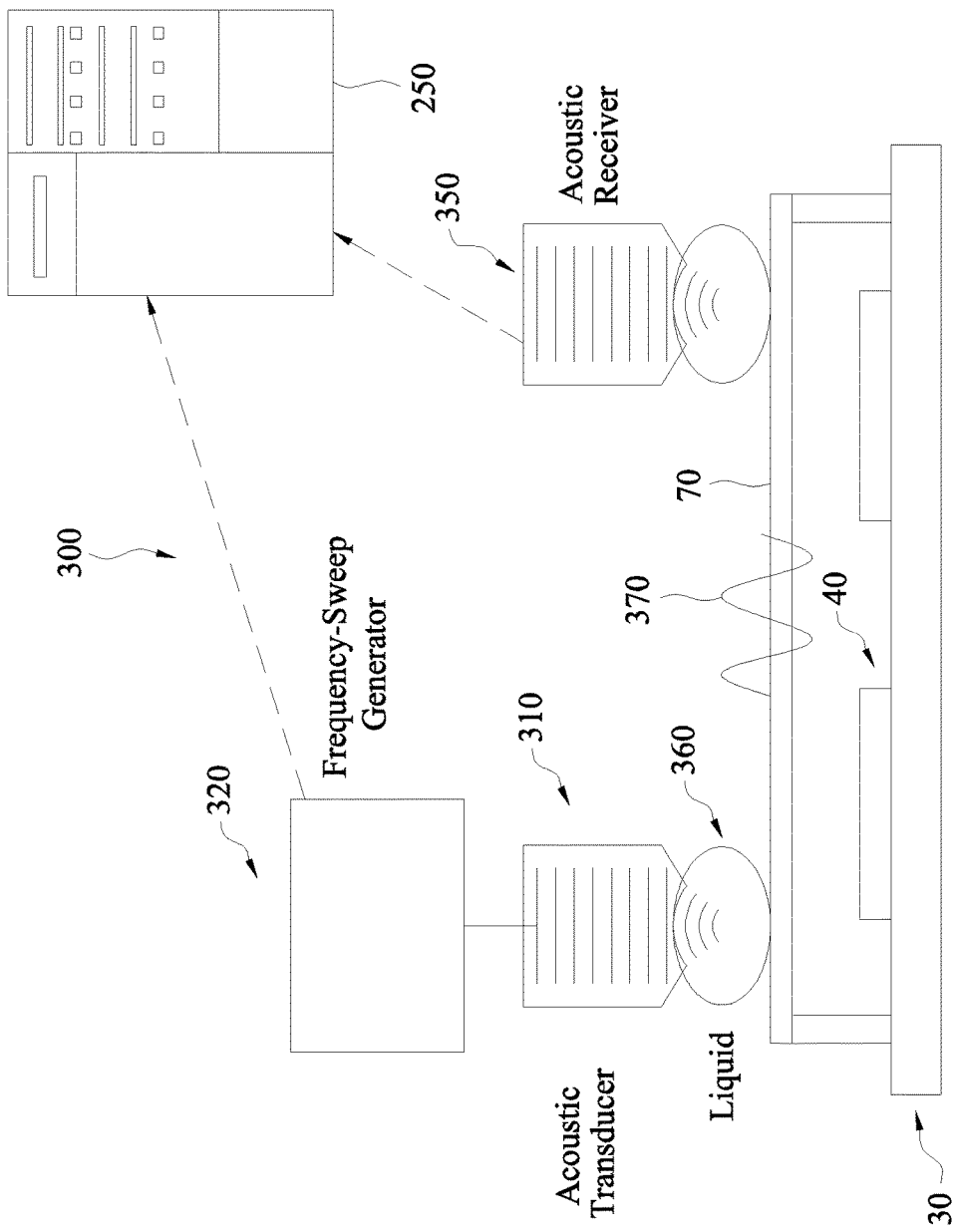

FIG. 7 illustrates a simplified schematic diagram of yet another embodiment of a system 300 for estimating or determining the aging condition of a pellicle. For reasons of clarity and consistency, the mask 30, the patterns 40 on the mask 30, and the pellicle 70 disposed over the mask 30 are labeled the same in FIG. 7. Instead of using an array acoustic transducer 110 as an acoustic wave generator (as in the case for the systems 100A/B/C in FIGS. 2, 4, and 5), the system 300 includes an acoustic transducer 310 and a frequency sweep generator (also referred to as a function generator) 320 coupled thereto as the acoustic wave generator. The acoustic transducer 310 is located over an end portion of the pellicle 70. The acoustic transducer 310 is similar to any one of the transducers 120-123 in systems 100A/B/C, and it can be used to produce a pressure wave or an acoustic wave toward the upper surface of the pellicle 70.

The frequency sweep generator 320 is configured to produce a plurality of frequencies, and thus the acoustic transducer 310 in conjunction with the frequency sweep generator 320 can generate a plurality of acoustic waves having different frequencies. In other words, the acoustic transducer 310 and the frequency sweep generator 320 can collectively perform a frequency sweep of acoustic waves on the pellicle 70. Thus, rather than forcing the pellicle into a certain mode of oscillation, the acoustic transducer 310 and the frequency sweep generator 320 can force the pellicle 70 into a plurality of different modes of oscillation (producing any number of N), though at different times.

The system 300 also includes an acoustic receiver 350 that detects the actual resonance frequency of the pellicle 70. The acoustic receiver 350 is located over another end portion of the pellicle 70 opposite the end portion over which the acoustic transducer 310 is located. Similar to the systems 100A/B/C, the system 300 can determine the age condition of the pellicle 70 based on the shift of the actual resonance frequency from the target resonance frequency. It is understood that liquid 360 may be applied on the pellicle 70 to reduce intensity loss of the acoustic wave.

In addition, the system 300 may also be used to estimate the age condition of the pellicle 70 via a calculation of Young's modulus. In more detail, the acoustic transducer 310 produces a signal 370 in the form of a traveling wave that propagates from one side of the pellicle 70 to the other. Alternatively stated, the acoustic transducer 310, via the acoustic wave generated, forces the pellicle 70 to vibrate in a manner such that it produces the traveling wave 370 (i.e., the pellicle 70 serves as the medium for the wave/signal 370). For the traveling wave 370, the amount of time it takes to propagate through a normal age condition pellicle is different from the amount of time it takes to propagate through an aging pellicle. This is because as the pellicle ages, it essentially becomes longer, and therefore the distance over which the wave 370 has to travel effectively increases.

Figure 8:
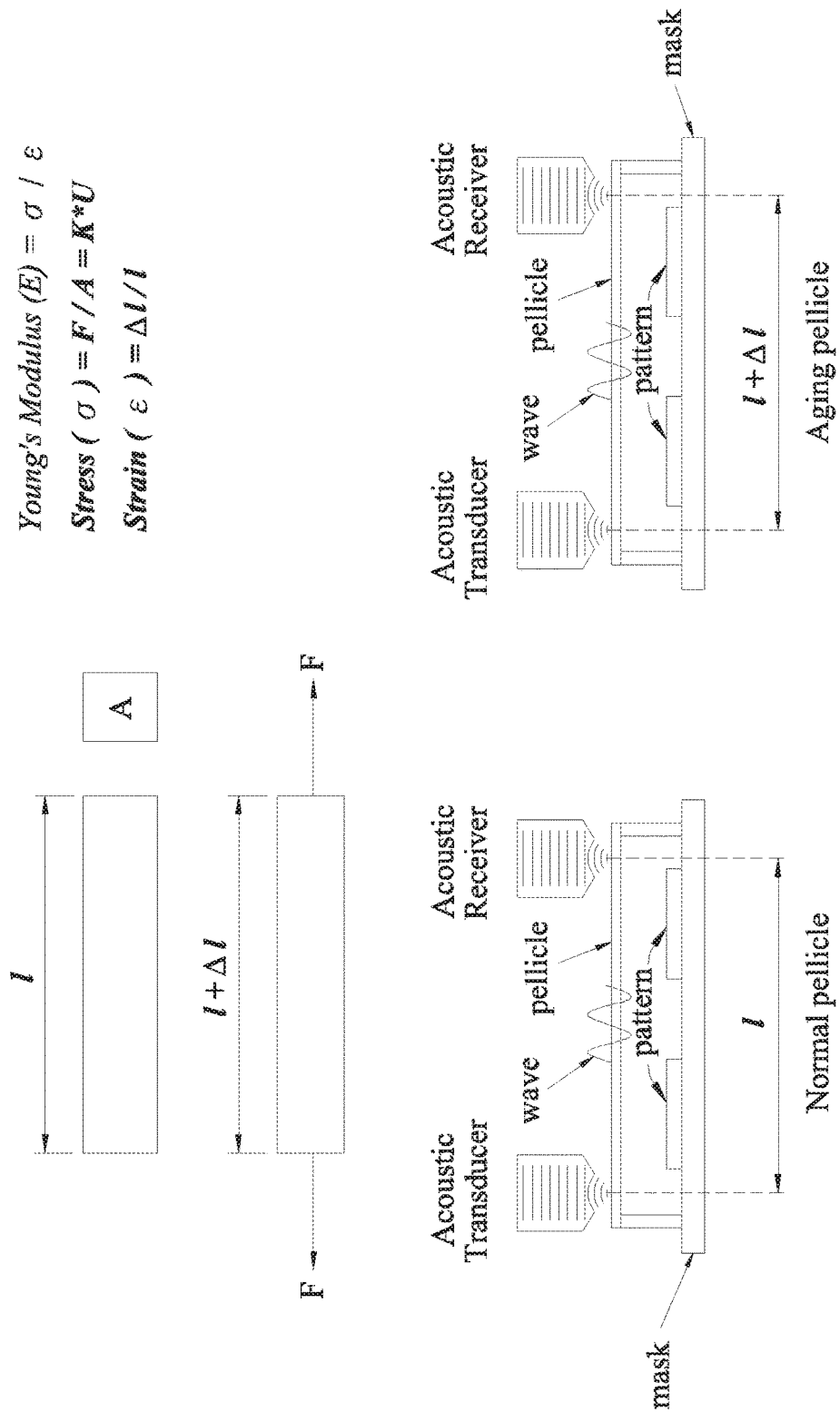
FIG. 8 includes visual illustrations of how a Young's modulus can be calculated to estimate the age condition of the pellicle according to embodiments of the present disclosure.

FIG. 8 provides a visual illustration of how a Young's modulus can be calculated to estimate the age condition of the pellicle. As is seen in FIG. 8, the aging of the pellicle due to lithography exposure causes the pellicle to expand from an original length/before an exposure process to a length of l+Δl after the exposure process. l represents the distance traveled by the acoustic wave when the pellicle is healthy (e.g., before the lithography exposure), and l+Δl represents the distance traveled by the acoustic wave when the pellicle has aged (e.g., after the lithography process). The traveling time of the wave can also be measured by the acoustic transducer and the acoustic receiver. Since distance=speed of the wave*traveling time, the difference in the distance due to pellicle aging (i.e., Δl) can also be calculated.

Knowing Δl and l, the strain ($\epsilon$) can also be calculated as $=\Delta l/l$. In addition, stress (a) is defined as $=F/A=K*U$, where F is the force on the pellicle, A is the cross-sectional area of the pellicle, U is the force provided by the acoustic force transducer and can be control by the frequency sweep generator (or function generator), and K is a parameter for unit matching F/A (N/m*2). Thus, the stress can also be calculated. Finally, Young's modulus (E) may be calculated as σ/ε.

Figure 9:
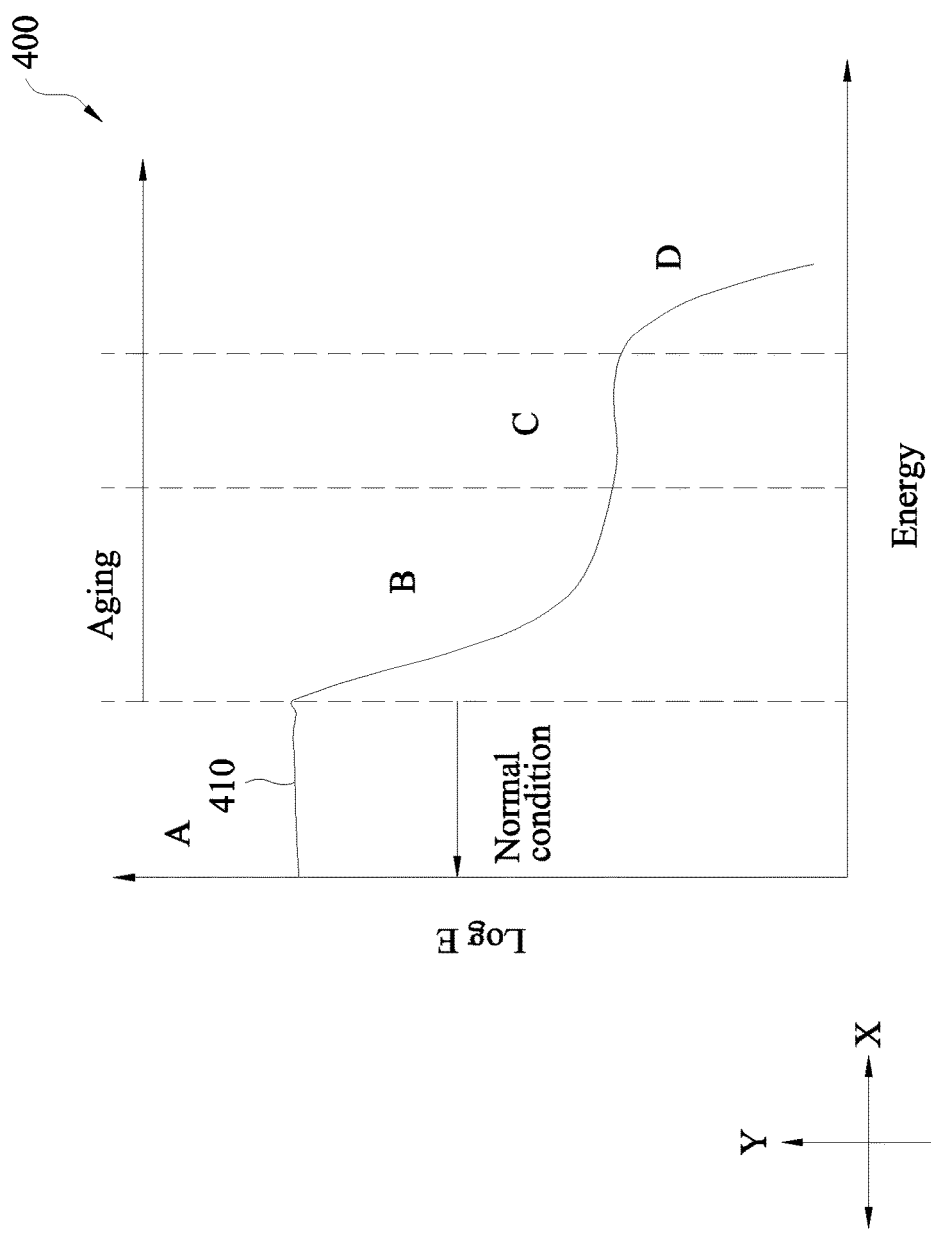
FIG. 9 is a graph of Young's modulus that visually illustrates various regions on the graph corresponding to different age conditions of the pellicle according to embodiments of the present disclosure.

Referring now to FIG. 9, a graph 400 illustrates how the age condition of the pellicle 70 can be determined based on Young's modulus (E). In more detail, the graph 400 includes an X-axis that represents energy (expressed in the form of temperature) accumulated as a result of the exposure process, as well as a Y-axis that represents a logarithmic value of Young's modulus (Log E). A plot 410 of the logarithmic value of Young's modulus versus energy is shown in the graph 400. The plot 410 visually demonstrates the age condition of the pellicle 70 based on its location in region A (referred to as a glassy region), region B (referred to as a glass transition region), region C (referred to as a rubbery plateau region), and region D (referred to as a rubbery flow region) in the graph 400.

When the plot 410 is within region A, it indicates that the pellicle 70's elastic behavior is between stress and strain. This corresponds to a good or normal age condition of the pellicle. When the plot 410 is outside the region A, the pellicle is considered to not be within a good or normal age condition, though the age condition becomes worse from region B to region C, and from region C to region D. Specifically, the glass transition region B is a region where the pellicle 70's behavior is between viscosity and elasticity, and thus it is at the early stages of aging. The rubbery plateau region C is a region where the pellicle 70's behavior is largely viscous in nature, and thus it is in advanced stages of aging. The rubbery flow region D is a region where the pellicle 70 has a non-linear Young's modulus and has large deformation. In other words, the pellicle 70 corresponding to region D is about to break or has already broken. In this manner, a person or a machine such as the computer or computerized equipment 250 (in FIG. 7, shown as being communicatively coupled to the frequency sweep generator 320 and/or the acoustic receiver 350) can precisely estimate the age condition of the pellicle 70. If the age condition of the pellicle 70 is deemed to be outside the acceptable range, it may be discarded before it breaks to avoid causing damage or other fabrication issues to the lithography photomask 30.

Figure 10:
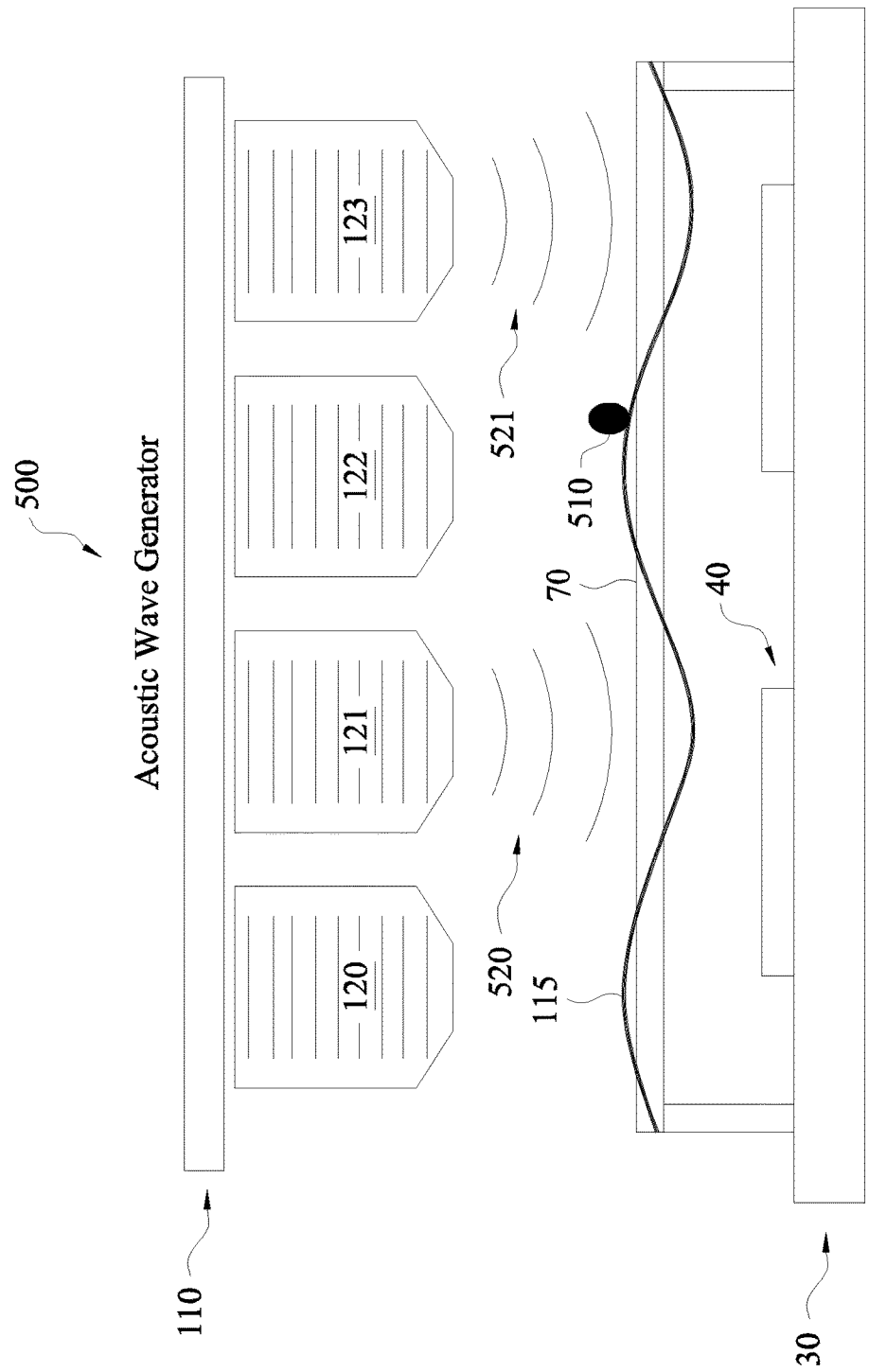
FIGS. 10-11 and 13 illustrate systems for removing contaminant particles from a pellicle according to embodiments of the present disclosure.

In addition to estimating the age condition of a pellicle, the systems 100A/B/C and 300 discussed can also be modified so as to remove contaminant particles on the pellicle. For example, referring now to FIG. 10, simplified diagrammatic vie of a particle removing system 500 is illustrated according to an embodiment of the present disclosure. The particle removing system 500 shares similar components with the systems 100A/B/C discussed above with reference to FIGS. 2 and 4-5, and therefore these similar components will be labeled the same herein for reasons of consistency and clarity.

As discussed above, a pellicle 70 is placed over the lithography photomask 30 (with patterns 40 formed thereon) to protect the photomask 30. One or more contaminant particles 510 are located on the pellicle 70. The presence of the contaminant particles 510 may be detected by machines or by the naked human eye in some circumstances. The contaminant particles 510, if not removed, may cause lithography problems such as incorrect focusing, etc. Therefore, it is desirable to remove the contaminant particles 510 from the pellicle 70. However, traditional methods of removing the contaminant particles from pellicle may easily damage the pellicle, as these traditional methods often involve mechanical tools and may require direct contact (or cause accidental contact) with the pellicle's surface.

According to the various aspects of the present disclosure, the particle removing system 500 utilizes the acoustic wave generator 110 to remove the contaminant particle 510. As discussed above with reference to FIG. 2, the acoustic wave generator 110 can generates acoustic waves, for example acoustic waves 520 and 521 to force the pellicle 70 into a certain mode of oscillation (as represented by the wave 115). The acoustic waves 520 and 521 may be similar to the acoustic waves 130 and 131 discussed above with reference to FIG. 2, or they may be different. For example, the acoustic waves 520-521 may have different amplitudes than the acoustic waves 130-131. As another example, the acoustic waves 520-521 may have different frequencies than the acoustic waves 130-131.

The oscillation or vibration of the pellicle 70 causes the contaminant particle 510 to be "thrown off" the pellicle 70. As such, the contaminant particle 510 is removed from the pellicle 70 with minimal likelihood of causing damage to the pellicle 70. Note that since the particle removing system 500 is not intended to estimate the age condition of the pellicle, the resonance detection tool such as the source 150A and sensor 150 or the Laser Doppler Interferometer 150 may all be omitted. Nevertheless, it is understood that the systems 100A/B/C that includes the resonance detection tool may also be used to remove the particles 510 herein. In those situations, the resonance detection tool may still be present, just not needed or used.

It is understood that depending on the location of the contaminant particle 510, the particle removing system 500 may be implemented slightly differently. For example, one way to tweak the design of the particle removing system 500 is to change the number or the location of the acoustic transducers 120-123. As is shown in FIG. 11, the particle removing system 500A has four acoustic transducers 120-123, the particle removing system 500B has three acoustic transducers 120-122, and the particle removing system 500C has two acoustic transducers 120-121.

With two transducers 121 and 123 (out of four transducers 120-123) active and generating the acoustic waves toward the pellicle 70, the pellicle 70 is forced into the fourth mode of oscillation (N=4). However, if the contaminant particle 510 is located at a node of the vibrating/oscillating pellicle 70, where the amplitude variation is substantially zero. Thus, the removal of the contaminant particle 510 by the system 500A may be difficult. In comparison, with one transducer 121 (out of three transducers 120-122) active and generating the acoustic wave toward the pellicle 70, the pellicle is forced into the third mode of oscillation (N=3). Now, the contaminant particle 510 is located outside the node of the vibrating/oscillating pellicle 70, and the amplitude variation is greater than zero but is not at the peak yet. Thus, the system 500B is better equipped than the system 500A in removing the contaminant particle 510, but it is still not optimized yet. With the system 500C, one transducer 120 (out of two transducers 120-121) is active and generating the acoustic wave toward the pellicle 70, the pellicle is forced into the second mode of oscillation (N=2). The contaminant particle 510 is located at the amplitude peak of the vibrating pellicle, and thus the system 500C is the best choice for removing the contaminant particle 510.

Based on the above discussions, it can be seen that the location of the contaminant particle 510 may impact the design choice of the particle removing system 500. As discussed above, the location of the contaminant particle 510 on the pellicle 70 can be either ascertained by machines or by a naked human eye. Once the location of the contaminant particle 510 is known, the particle removing system 500 may then be designed such that the peak amplitude (in a direction pointing away from the pellicle) of the vibrating pellicle 70 coincides with the location of the contaminant particle. This may have the greatest effect in "throwing" the contaminant particle 510 away from the pellicle 70. In furtherance of this goal, the number of the acoustic transducers may be varied in order to generate a desired mode of oscillation (N), such that the peak amplitude is where it is supposed to be.

Figure 11:
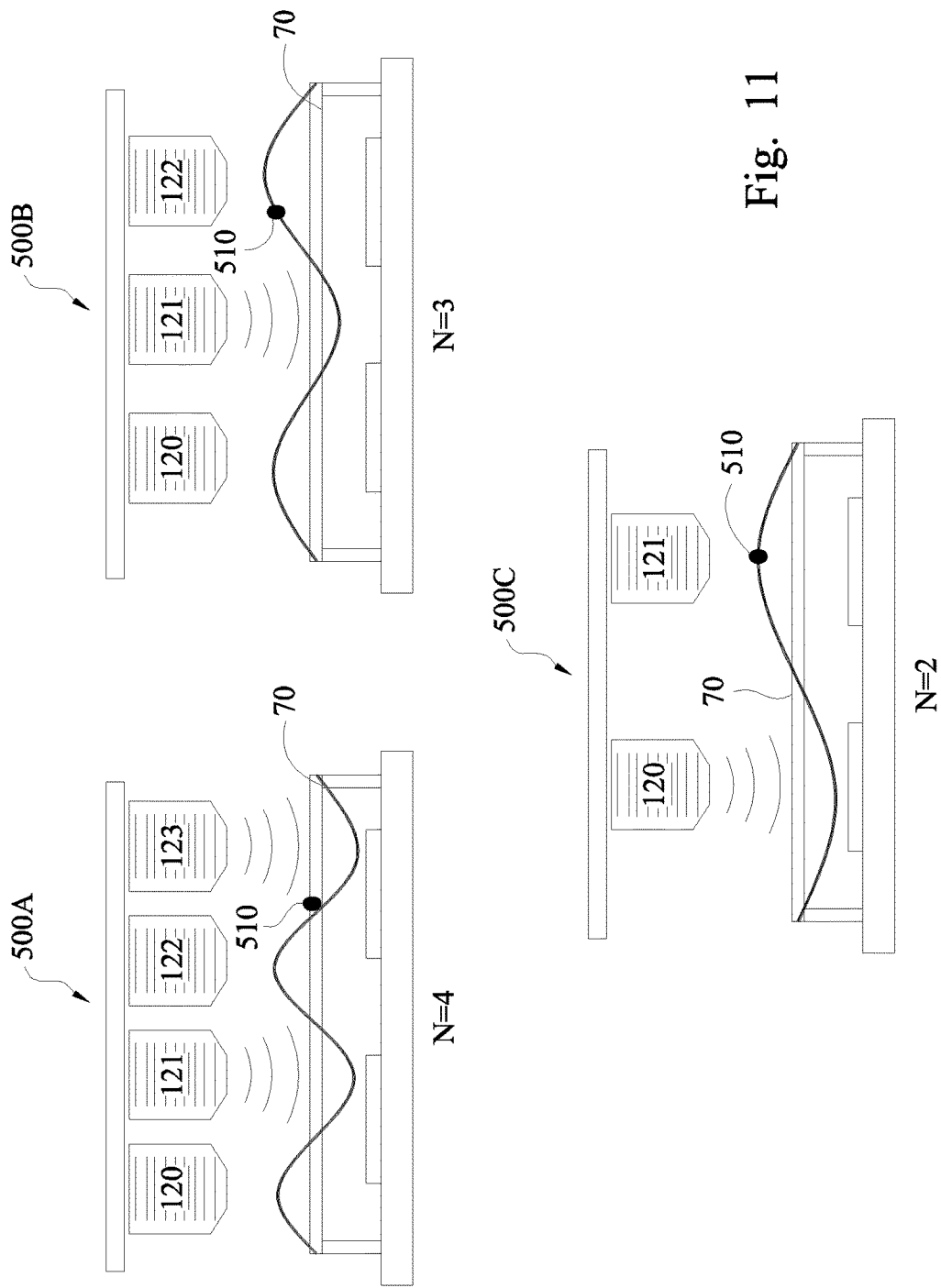

It is also understood that in the systems 500A-500C illustrated in FIG. 11, the inactive transducers (i.e., the ones that are not generating acoustic waves, such as transducers 120 and 122 in system 500A) may be removed. However, the removal of these inactive transducers may mean that a vibration/wave of the same oscillation mode but opposite in amplitude may not be achieved. Hence, in embodiments where versatility is desired (e.g., the versatility to produce two waves having opposite amplitudes but the same oscillation mode N), the inactive acoustic transducers may still be kept.

Alternatively, the acoustic wave generator may be implemented in a manner such that the acoustic transducers can be laterally moved around. For example, if the transducers 120 and 122 are eliminated from the system 500A, the acoustic transducers 121 and 123 may have the capability to be laterally shifted to the left, so that the acoustic transducer 121 takes the place of the acoustic transducer 120, and the acoustic transducer 123 takes the place of the acoustic transducer 122. In this manner, the two acoustic transducers 121 and 123 can still generate the waves of opposite amplitude if needed. And generally speaking, an acoustic wave generator with movable acoustic transducers implemented thereon is more versatile in producing acoustic waves to force the pellicle into a desired mode of oscillation, as well as in creating peak amplitude locations that coincide with the location of the contaminant particles on the pellicle.

Figure 12:
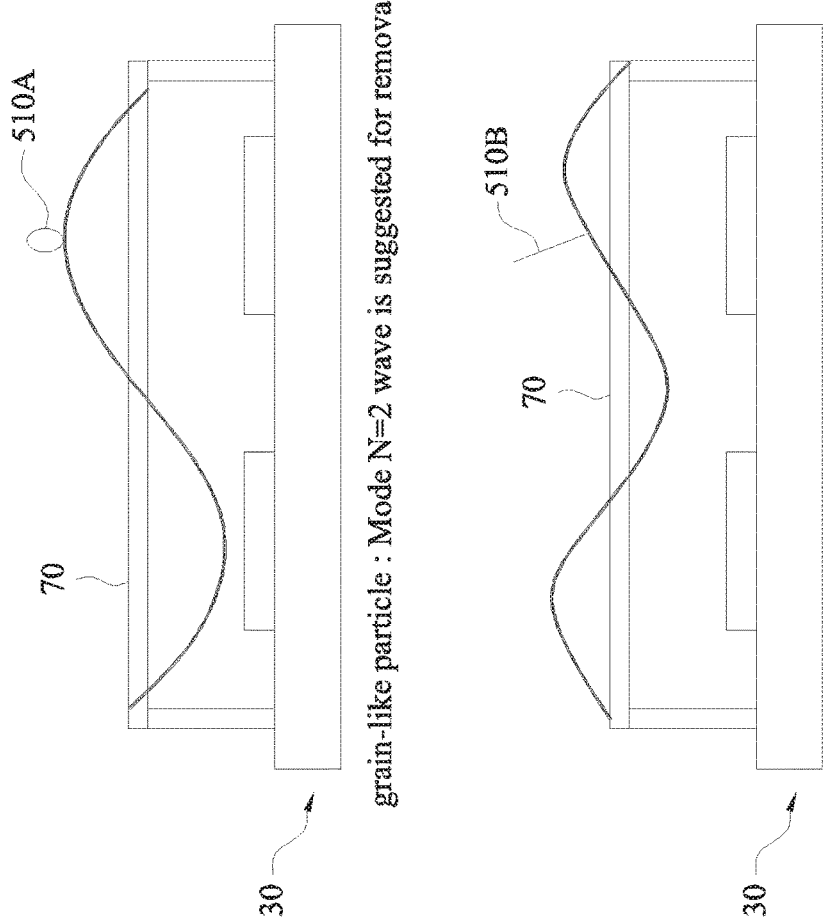
FIG. 12 visually illustrates how different types of contaminant particles impact the design choices of particle removing systems according to embodiments of the present disclosure.

The type of the contaminant particle may also impact the design choice of the particle removing system. Referring to FIG. 12, two different example types of contaminant particles 510A and 510B are illustrated. The contaminant particle 510A is a grain-like particle. As such, the second mode of oscillation (N=2) may be suited for its removal. That is, the acoustic wave generator is configured to force the pellicle into the N=2 mode of oscillation, such that the peak amplitude of the wave is aligned with the location of the contaminant particle 510A. The peak amplitude swing of the wave offers the best likelihood of "throwing" the contaminant particle 510A away from the pellicle 70. In comparison, the contaminant particle 510B is a needle-like particle. As such, it may be somewhat stuck into the pellicle 70. If a mode N=2 wave is used, as was the case for particle 510A, the peak amplitude swing is still vertical in nature, and it may not be able to effectively remove the contaminant particle 510B. If the mode N=3 wave is generated, such that the location of the contaminant particle 510B is located in between the node of the wave (where there is no vertical or horizontal swing) and the peak (where the vertical swing is the greatest), the wave may have both a vertical and a horizontal swing component. As a result, the needle-like particle 510B is more likely to be removed by such wave. In this manner, the design of the particle removing system is based on not only the location of the contaminant particles, but also the type of the contaminant particles.

Figure 13:
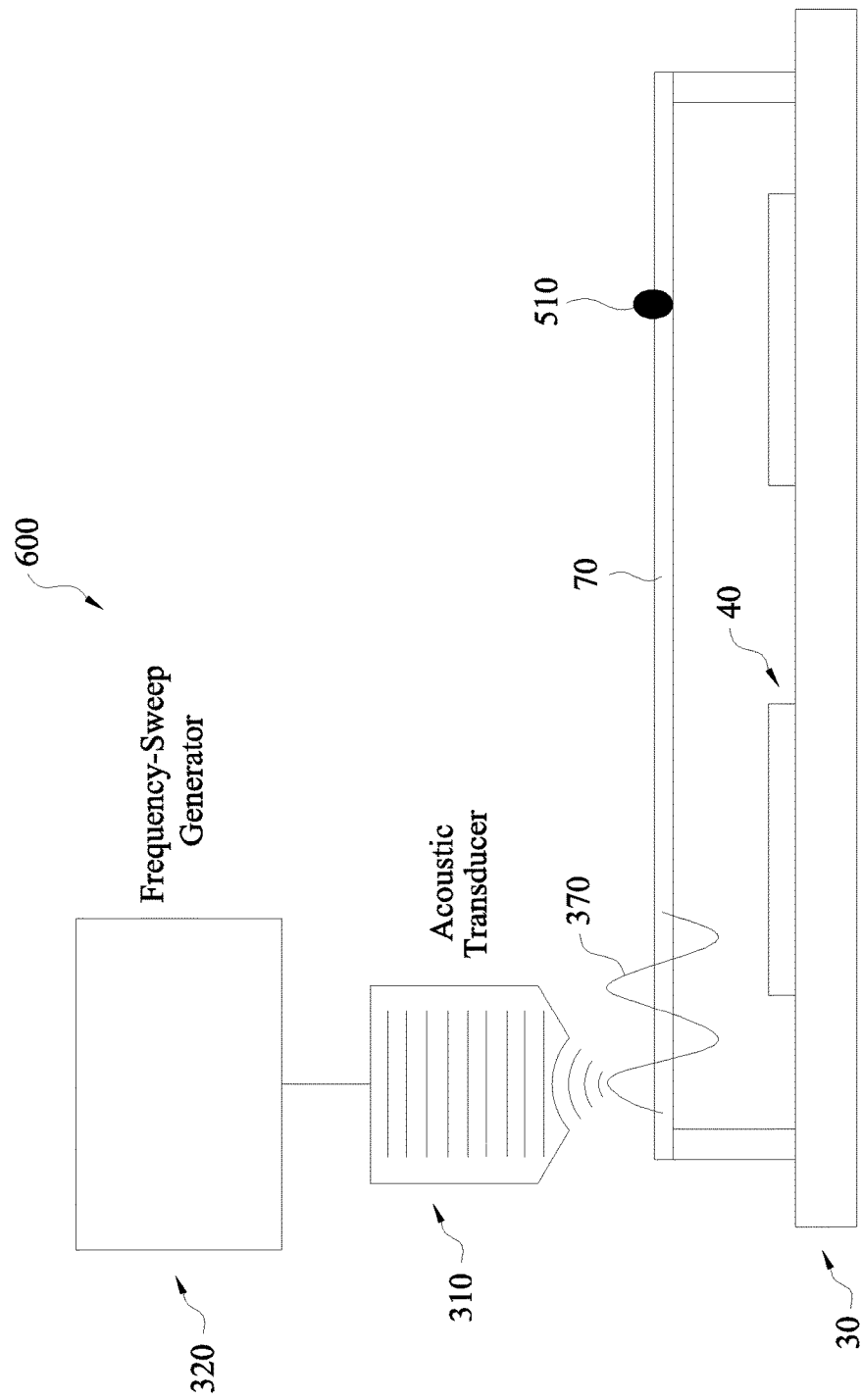

Referring now to FIG. 13, another embodiment of a particle removing system 600 is illustrated. The particle removing system 600 shares similar components with the systems 300 discussed above with reference to FIG. 7, and therefore these similar components will be labeled the same herein for reasons of consistency and clarity. Similar to system 300, the system 600 includes an acoustic transducer 310 that is coupled to a frequency-sweep generator 320 (of function generator). Together, the acoustic transducer 310 and the frequency-sweep generator 320 can perform a frequency sweep on the pellicle 70. As such, the system 600 can force the pellicle 70 into a plurality of modes of oscillation (i.e., N=1, N=2, N=3, N=4, etc.). The vibration or oscillation of the pellicle 70 can remove the contaminant particle 510 disposed thereon. Alternatively, the acoustic transducer 310 can also produce a traveling wave 370 that propagates from one side of the pellicle 70 to the other. The traveling wave 370 may also facilitate in the removing of the contaminant particle 510. Again, the particle removing system 600 can remove the contaminant particles with minimal likelihood of damaging the pellicle 70, for example since no mechanical tools need to directly touch the pellicle 70.

Figure 14:
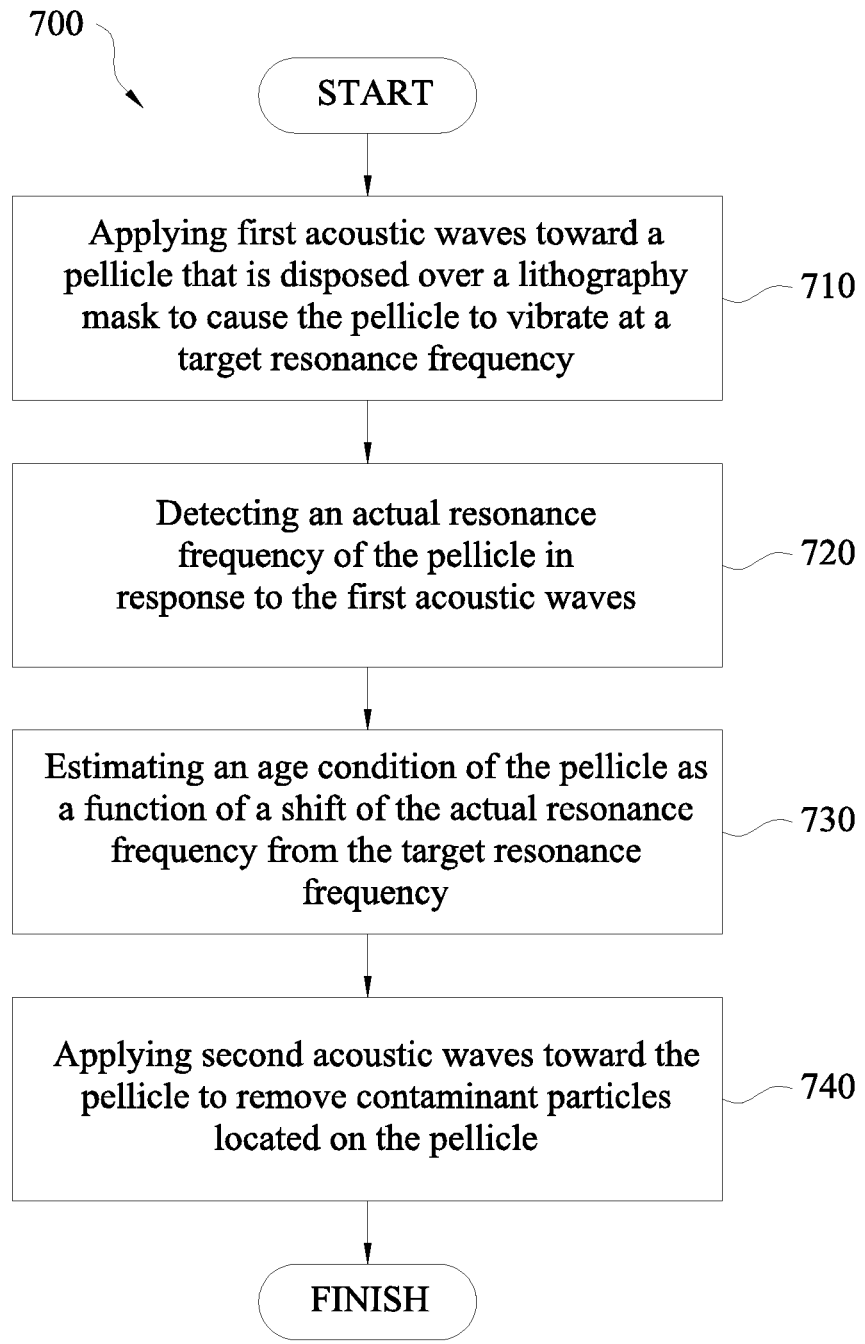
FIGS. 14-15 are flowcharts of methods of estimating an age condition of a pellicle and removing contaminant particles from the pellicle in accordance with some embodiments.

FIG. 14 is a flowchart illustrating a simplified method 700 of estimating an age condition of a pellicle and removing contaminant particles from the pellicle. The method 700 includes a step 710 of applying acoustic waves toward a pellicle that is disposed over a lithography mask to cause the pellicle to vibrate at a target resonance frequency. In some embodiments, the acoustic waves are generated via an array acoustic transducer or a microphone. In some embodiments, the step 710 of applying the first acoustic waves comprises forcing the pellicle to vibrate at a predetermined mode of oscillation.

The method 700 includes a step 720 of detecting an actual resonance frequency of the pellicle in response to the first acoustic waves. In some embodiments, the step 720 of detecting the actual resonance frequency of the pellicle includes the following steps: generating, via a source located on a first side of the pellicle, a signal that travels across the pellicle; receiving the signal via a sensor located on a second side of the pellicle opposite the first side; and detecting the actual resonance frequency based on the received signal. In some embodiments, the source includes a laser, and the sensor includes a photo receiver. In some embodiments, the source includes a light, and the sensor includes a charge-coupled device (CCD). In other embodiments, the actual resonance frequency is detected via a Laser Doppler Interferometer.

The method 700 includes a step 730 of estimating an age condition of the pellicle as a function of a shift of the actual resonance frequency from the target resonance frequency. In some embodiments, the estimating is performed by one or more electronic processors.

The method 700 includes a step 740 of applying second acoustic waves toward the pellicle to remove contaminant particles located on the pellicle.

It is understood that additional fabrication processes may be performed before, during, or after the steps 710-740. For example, the method 700 may include an additional step of discarding and/or replacing the pellicle if the pellicle is estimated to have aged beyond an acceptable condition. Other fabrication processes are not discussed in detail herein for reasons of simplicity.

Figure 15:
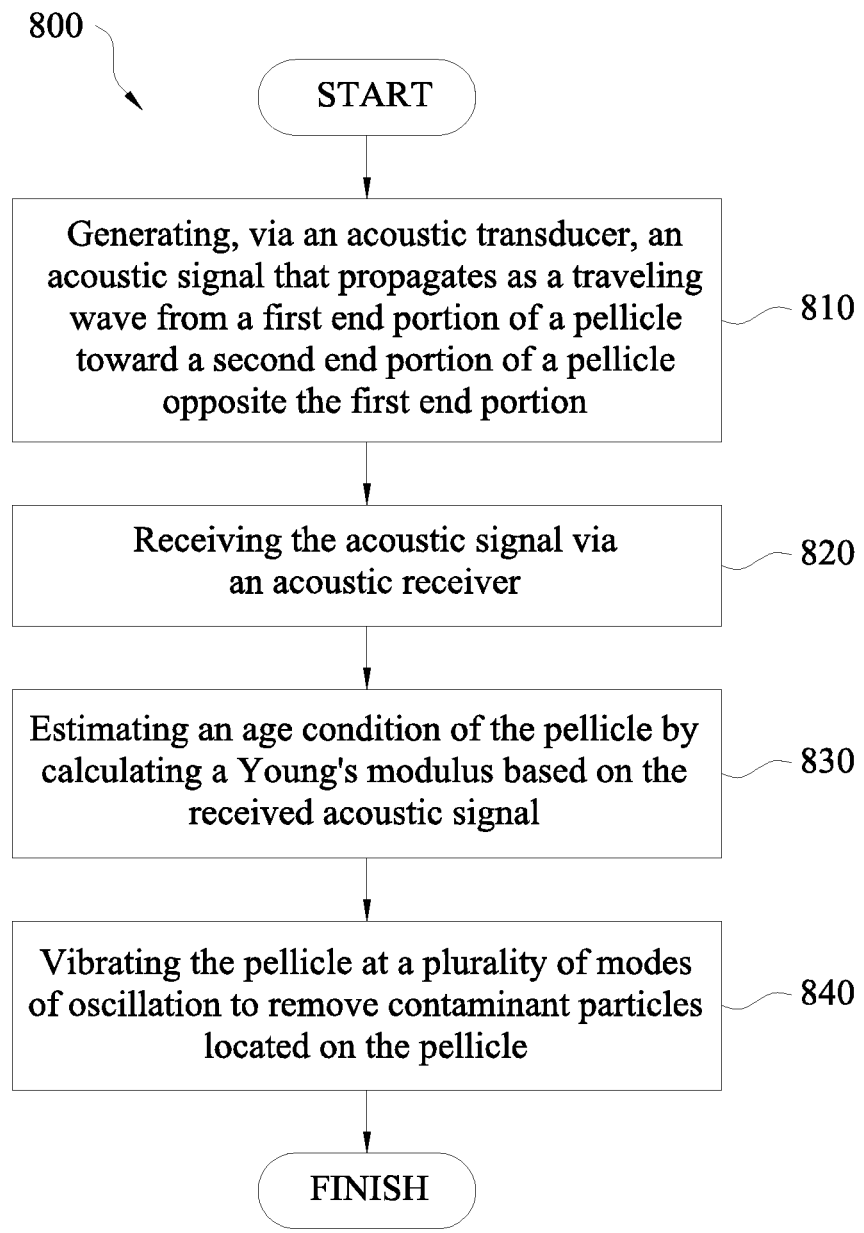

FIG. 15 is a flowchart illustrating a simplified method 800 of estimating an age condition of a pellicle and removing contaminant particles from the pellicle. The method 800 includes a step 810 of generating an acoustic signal that propagates as a traveling wave from a first end portion of a pellicle toward a second end portion of a pellicle opposite the first end portion. The pellicle is placed over a lithography mask. An acoustic transducer is disposed over the first end portion of the pellicle and is used to generate the acoustic signal. An acoustic receiver is disposed over the second end portion of the pellicle.

The method 800 includes a step 820 of receiving the acoustic signal. The acoustic signal is received by the acoustic receiver.

The method 800 includes a step 830 of estimating an age condition of the pellicle by calculating a Young's modulus based on the received acoustic signal. In some embodiments, the estimating is performed by one or more electronic processors. In some embodiments, the estimating includes ascertaining whether a logarithmic value of the Young's modulus falls within a glassy region, a glass transition region, a rubbery plateau region, or a rubbery flow region.

The method 800 includes a step 840 of vibrating the pellicle at a plurality of modes of oscillation to move contaminant particles on the pellicle. The plurality of modes of oscillation may be caused in part by a frequency-sweep generator coupled to the acoustic transducer.

It is understood that additional fabrication processes may be performed before, during, or after the steps 810-840. As an example, the method 800 may include an additional step of discarding and/or replacing the pellicle if the pellicle is estimated to have aged beyond an acceptable condition. Other fabrication processes are not discussed in detail herein for reasons of simplicity.

Based on the above discussions, it can be seen that the present disclosure offers various advantages. It is understood, however, that not all advantages are necessarily discussed herein, and other embodiments may offer different advantages, and that no particular advantage is required for all embodiments.

One of the advantages is that the present disclosure offers a novel way of estimating the age condition of the pellicle. As discussed above, as pellicles age, their optical, thermal, and mechanical properties begin to change. If the age condition of the pellicle is not accurately detected and monitored, it may break, which could cause damage to the lithography photomask that the pellicle is supposed to protect. Repair or replacement of lithography photomasks are expensive and should be avoided. Thus, it is desirable to know ahead of time when the pellicle's age condition is bad enough that it should be discarded. The present disclosure estimates the age condition of the pellicle by acoustic waves or traveling waves. This method is fast, accurate, and minimally invasive. With the age condition of the pellicle known, damage to the lithography photomask is unlikely, and thus fabrication costs can be kept low.

Another advantage of the present disclosure is the novel way to remove contaminant particles from pellicles. For example, the systems used to estimate the age of the pellicles may also be modified into particle removal systems. By generating acoustic waves, the pellicle membrane vibrates or swings, thereby throwing the particles off of the surface of the pellicle. Since the particle removal herein requires no mechanical handling of the pellicle or direct surface contact thereof, it minimizes the likelihood of damaging the pellicle during the particle removal. In addition, different types of particle removal systems may also be flexibly designed depending on the location of the contaminant particles and the type of the contaminant particles. Consequently, even contaminant particles that may have been tough to remove via traditional methods can be removed by a system of the present disclosure that is tailor-designed for the removal of these specific contaminant particles.

The present disclosure provides for a system in accordance with some embodiments. A pellicle is disposed over a lithography mask. An acoustic wave generator is placed over the pellicle. The acoustic wave generator is configured to generate acoustic waves to cause the pellicle to vibrate at a target resonance frequency. A resonance detection tool is configured to detect an actual resonance frequency of the pellicle in response to the acoustic waves. One or more electronic processors are configured to estimate an age condition of the pellicle as a function of a shift of the actual resonance frequency from the target resonance frequency.

The present disclosure provides for a method of estimating the age of a pellicle. Acoustic waves are applied toward a pellicle that is disposed over a lithography mask to cause the pellicle to vibrate at a target resonance frequency. An actual resonance frequency of the pellicle is detected in response to the acoustic waves. An age condition of the pellicle is estimated as a function of a shift of the actual resonance frequency from the target resonance frequency.

The present disclosure provides for a system. A pellicle is disposed over a lithography mask. An acoustic transducer is disposed over a first end portion of the pellicle. An acoustic receiver is disposed over a second end portion of the pellicle opposite the first end portion. The system also includes one or more electronic processors. The acoustic transducer is configured to generate an acoustic signal that propagates as a traveling wave from the first end portion toward the second end portion. The acoustic receiver is configured to receive the acoustic signal. The one or more electronic processors are configured to estimate an age condition of the pellicle by calculating a Young's modulus based on the received acoustic signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
    a pellicle disposed over a lithography mask, the pellicle having a surface;
    an acoustic wave generator placed over the pellicle, wherein the acoustic wave generator is configured to generate acoustic waves to cause the pellicle to vibrate at a target resonance frequency;
    a resonance detection tool configured to:
        generate a signal that travels across a surface of the pellicle in a direction parallel to the surface of the pellicle;
        measure the signal after the signal travels across the surface of the pellicle in the direction parallel to the surface of the pellicle; and
        determine, based on the measured signal, an actual resonance frequency of the pellicle in response to the acoustic waves; and one or more electronic processors configured to estimate an age condition of the pellicle as a function of a shift of the actual resonance frequency from the target resonance frequency.

2. The system of claim 1, wherein the acoustic wave generator includes a plurality of acoustic transducers.

3. The system of claim 1, wherein the acoustic wave generator is configured to generate the acoustic waves to force the pellicle to vibrate at a predetermined mode of oscillation.

4. The system of claim 1, wherein the signal travels an entire length of the surface of the pellicle, and wherein the resonance detection tool includes:
a source located at a first location, the source being configured to generate the signal that travels across the surface of the pellicle; and
a sensor located at a second location, the sensor being configured to receive the signal, wherein the entire length of the surface of the pellicle is located between the first location and the second location.

5. The system of claim 4, wherein the source includes a laser, and wherein the sensor includes a photo receiver.

6. The system of claim 4, wherein the source includes a light, and wherein the sensor includes a charge-coupled device (CCD).

7. The system of claim 1, wherein the resonance detection tool includes a Laser Doppler Interferometer.

8. The system of claim 1, wherein the acoustic waves are first acoustic waves, and wherein the acoustic wave generator is further configured to generate second acoustic waves for removing contaminant particles located on the pellicle.

9. A method, comprising:
applying, via a generator located over a pellicle that is disposed over a lithography mask, acoustic waves toward the pellicle to cause the pellicle to vibrate at a target resonance frequency;
generating, via a source located on a first side of the pellicle, a signal that travels in a direction parallel to a surface of the pellicle and across an entire length of the pellicle;
measuring the generated signal, the measuring comprises receiving the signal via a sensor located on a second side of the pellicle opposite the first side;
detecting, based on the measured signal, an actual resonance frequency of the pellicle in response to the acoustic waves; and
estimating an age condition of the pellicle as a function of a shift of the actual resonance frequency from the target resonance frequency.

10. The method of claim 9, wherein the applying comprises generating the acoustic waves via an array acoustic transducer.

11. The method of claim 9, further comprising:
determining, for each of a plurality of modes of oscillation, a resonance frequency shift between an aging pellicle and a new pellicle; and
determining that a first mode of the plurality of modes of oscillation corresponds to a largest resonance frequency shift;
wherein the applying comprises forcing the pellicle to vibrate at the first mode of oscillation.

12. The method of claim 9, wherein the source includes a laser, and wherein the sensor includes a photo receiver.

13. The method of claim 9, wherein the source includes a light, and wherein the sensor includes a charge-coupled device (CCD).

14. The method of claim 9, wherein the detecting comprises detecting the actual resonance frequency via a Laser Doppler Interferometer.

15. The method of claim 9, wherein the acoustic waves are first acoustic waves, and further comprising applying second acoustic waves toward the pellicle to remove contaminant particles located on the pellicle.

16. A system, comprising:
a pellicle disposed over a lithography mask, the pellicle having a surface that spans in a first direction;
an acoustic wave generator positioned over the pellicle, wherein the acoustic wave generator is configured to apply acoustic waves toward the surface of the pellicle to force the pellicle to vibrate at a target resonance frequency;
a signal-transmitter disposed over a first end portion of the pellicle;
a signal-receiver disposed over a second end portion of the pellicle opposite the first end portion; and
one or more electronic processors;
wherein:
the signal-transmitter is configured to generate a signal that propagates in the first direction as a traveling wave from the first end portion toward the second end portion;
the signal-receiver is configured to receive and measure the signal after the signal reaches the second end portion; and
the one or more electronic processors are configured to:
determine, based on the measured signal, an actual resonance frequency of the pellicle; and
estimate an age condition of the pellicle by comparing the target resonance frequency and the actual resonance frequency.

17. The system of claim 16, wherein the one or more electronic processors are configured to estimate the age condition of the pellicle by calculating a Young's modulus based on the measured signal and ascertaining whether a logarithmic value of the Young's modulus falls within any one of a plurality of different regions, wherein the different regions correspond to different age conditions of the pellicle.

18. The system of claim 16, further comprising a frequency sweep generator coupled to the signal-transmitter, wherein the frequency sweep generator is configured to cause the pellicle to vibrate at a plurality of oscillation modes.

19. The system of claim 18, wherein the plurality of oscillation modes are configured to remove contaminant particles located on the pellicle.

20. The system of claim 16, wherein:
the signal-transmitter includes an acoustic transducer; and
the signal-receiver includes an acoustic-receiver.

* * * * *